United States Patent
Takahashi et al.

(10) Patent No.: US 12,388,359 B2
(45) Date of Patent: Aug. 12, 2025

(54) POWER CONVERSION DEVICE

(71) Applicant: Mitsubishi Electric Corporation, Tokyo (JP)

(72) Inventors: Keita Takahashi, Tokyo (JP); Yusuke Tsubaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 414 days.

(21) Appl. No.: 17/918,587

(22) PCT Filed: Jul. 3, 2020

(86) PCT No.: PCT/JP2020/026166
§ 371 (c)(1),
(2) Date: Oct. 13, 2022

(87) PCT Pub. No.: WO2022/003945
PCT Pub. Date: Jan. 6, 2022

(65) Prior Publication Data
US 2023/0145046 A1    May 11, 2023

(51) Int. Cl.
*H05K 9/00* (2006.01)
*H02M 1/44* (2007.01)
*H05K 1/02* (2006.01)

(52) U.S. Cl.
CPC ............ *H02M 1/44* (2013.01); *H05K 1/0218* (2013.01); *H05K 9/0037* (2013.01); *H05K 9/0039* (2013.01)

(58) Field of Classification Search
CPC .................................. H05K 9/0037
USPC ........................ 361/799, 816, 818
See application file for complete search history.

(56) References Cited

U.S. PATENT DOCUMENTS

| | | | |
|---|---|---|---|
| 2013/0100634 A1 | 4/2013 | Okubo et al. | |
| 2015/0171736 A1* | 6/2015 | Takemoto | H05K 9/0075 363/17 |
| 2015/0194898 A1 | 7/2015 | Shinohara et al. | |
| 2018/0019663 A1 | 1/2018 | Fukumasu et al. | |

(Continued)

FOREIGN PATENT DOCUMENTS

| | | |
|---|---|---|
| JP | 2013-90533 A | 5/2013 |
| JP | 2014-33531 A | 2/2014 |

(Continued)

OTHER PUBLICATIONS

International Search Report and Written Opinion mailed on Sep. 24, 2020, received for PCT Application PCT/JP2020/026166, filed on Jul. 3, 2020, 10 pages including English Translation.

(Continued)

*Primary Examiner* — Hung S. Bui
(74) *Attorney, Agent, or Firm* — XSENSUS LLP

(57) ABSTRACT

A reference potential pattern in a printed board of a power conversion device is connected to a housing, an electromagnetic shield region surrounded by a shield wall of the housing and the reference potential pattern is formed, a power conversion circuit is provided outside the electromagnetic shield region, a conductive path connected to the control circuit and the power conversion circuit is wired into the electromagnetic shield region via a first connection hole of the printed board from the outside of the electromagnetic shield region.

19 Claims, 19 Drawing Sheets

(56) References Cited

U.S. PATENT DOCUMENTS

2018/0342947 A1* 11/2018 Werker ................ H05K 9/0037
2019/0296637 A1* 9/2019 Li ........................... H02P 27/06

FOREIGN PATENT DOCUMENTS

| JP | 2016-158423 A | 9/2016 |
|---|---|---|
| JP | 2017-85800 A | 5/2017 |

OTHER PUBLICATIONS

Chinese Office Action dated Apr. 22, 2025 of the corresponding Chinese patent application No. CN202080102526.4, 11pp.

\* cited by examiner

POWER CONVERSION DEVICE

CROSS-REFERENCE TO RELATED APPLICATION

The present application is based on PCT filing PCT/JP2020/026166, filed Jul. 3, 2020, the entire contents of which are incorporated herein by reference.

TECHNICAL FIELD

The present disclosure relates to a power conversion device.

BACKGROUND ART

In recent years, power conversion devices have achieved miniaturization of components by an increase in switching frequency, and an increase in power and density by high-density mounting of components. The noise source of a power conversion device is the switching noise of semiconductor elements, and measures are usually taken by using a filter circuit to prevent noise from propagating to the outside of the device. However, the amount of noise is increased due to the increase in switching frequency, and the electromagnetic coupling between components is increased due to the high-density mounting. Therefore, noise propagating the space between components that are not connected by an electric wire has become too large to be ignored. Therefore, in addition to merely providing the filter circuit, a design that reduces the electromagnetic coupling between a power conversion circuit and the filter circuit to suppress noise propagating the space is needed.

Therefore, a configuration in which regions for accommodating the power conversion circuit and the filter circuit are demarcated inside a metal housing and a shield wall is provided so as to reduce the electromagnetic coupling between the respective regions, has been conventionally proposed. When shielding the area between the power conversion circuit and the filter circuit, it is necessary to accommodate the filter circuit in a shield space surrounded by a metal. A bottom surface and a side surface of the shield space can be easily shielded by using a bottom surface, an outer wall, and an inner wall of the metal housing of the power conversion device. An upper surface of the shield space can be shielded by using a metal plate, but the addition of the metal plate causes a problem that the size and the weight of the device are increased. In order to solve such a problem, for example, a power supply device as a power conversion device having the following configuration is disclosed.

That is, the conventional power supply device has a case, a first board, a rectifying section, a transformer, a filter section, and an output stabilizing section. The case body has a plurality of blocking portions, and a plurality of accommodation portions are formed therein. The accommodation portions are demarcated by these blocking portions. A first shielding section is disposed between the rectifying section and a filter mechanism. A second shielding section is disposed between the filter section and the output stabilizing section. The first shielding section and the second shielding section serve to shield noise. Slits for allowing connection lines to pass therethrough are formed in the first shielding section and the second shielding section. These slits have different slit widths and depths depending on the placement of busbars. A second board and a third board are multilayer printed boards, and are both located close to a case lid. The second and third boards each have a placement layer on which circuit elements, components, etc. are placed, and also a ground layer which is at least one layer other than the placement layer and shields noise on almost the entire surface of the board (see, for example, Patent Document 1).

CITATION LIST

Patent Document

Patent Document 1: Japanese Laid-Open Patent Publication No. 2013-90533 (paragraphs [0018] to [0040] and FIG. 1 to FIG. 5)

SUMMARY OF THE INVENTION

Problems to be Solved by the Invention

In the power supply device having such a configuration, it is proposed to form the ground layer by a metal pattern of the printed board and shield the upper surface of the shield space. However, a wire connecting from the outside of the shield space to the inside of the shield space is electromagnetically coupled from the outside of the shield space, whereby noise propagating into the shield space cannot be prevented. Furthermore, there is a problem that noise leaks from a gap such as a slit of a housing wall for allowing the wire to pass therethrough from the outside of the shield space to the inside of the shield space, and noise propagating into the shield space cannot be prevented.

The present disclosure has been made to solve the above problems, and an object of the present disclosure is to provide a small-sized power conversion device that suppresses noise.

Solution to the Problems

A power conversion device according to the present disclosure is a power conversion device including a power conversion circuit which converts power and a control circuit which controls the power conversion circuit, the power conversion device including:
  a filter circuit which is connected to a control conductive path for controlling at least either the control circuit or the power conversion circuit and suppresses electromagnetic noise in the control conductive path;
  a circuit wiring board which is a printed board on which the filter circuit is provided and in which a reference potential pattern is formed on an inner layer; and
  a housing which holds the circuit wiring board, wherein
  the reference potential pattern is connected to the housing,
  the housing has a shield wall which is provided at a side of a first main surface which is a surface layer on one side in a thickness direction of the circuit wiring board, an electromagnetic shield region which is surrounded by the shield wall and the reference potential pattern is formed in the housing, and the control circuit and the power conversion circuit are provided outside the electromagnetic shield region,
  the control conductive path is wired into the electromagnetic shield region so as to be led from the control circuit into the electromagnetic shield region via a first connection hole which connects wiring conductors on at least two layers of the circuit wiring board, and
  the filter circuit has
    a first capacitor which is provided inside the electromagnetic shield region of the circuit wiring board, connected at a first end thereof to the control conductive path inside the electromagnetic shield region, and connected at a second end thereof to the reference potential pattern, and a second capacitor which is provided outside the electromagnetic shield region of the circuit wiring board, connected at a first end thereof to the control conductive path, and connected at a second end thereof to the reference potential pattern.

Effect of the Invention

The power conversion device according to the present disclosure makes it possible to obtain a small-sized power conversion device that suppresses noise.

DESCRIPTION OF EMBODIMENTS

Embodiment 1

First, a power conversion device according to Embodiment 1 of the present disclosure will be described.

Figure 1:
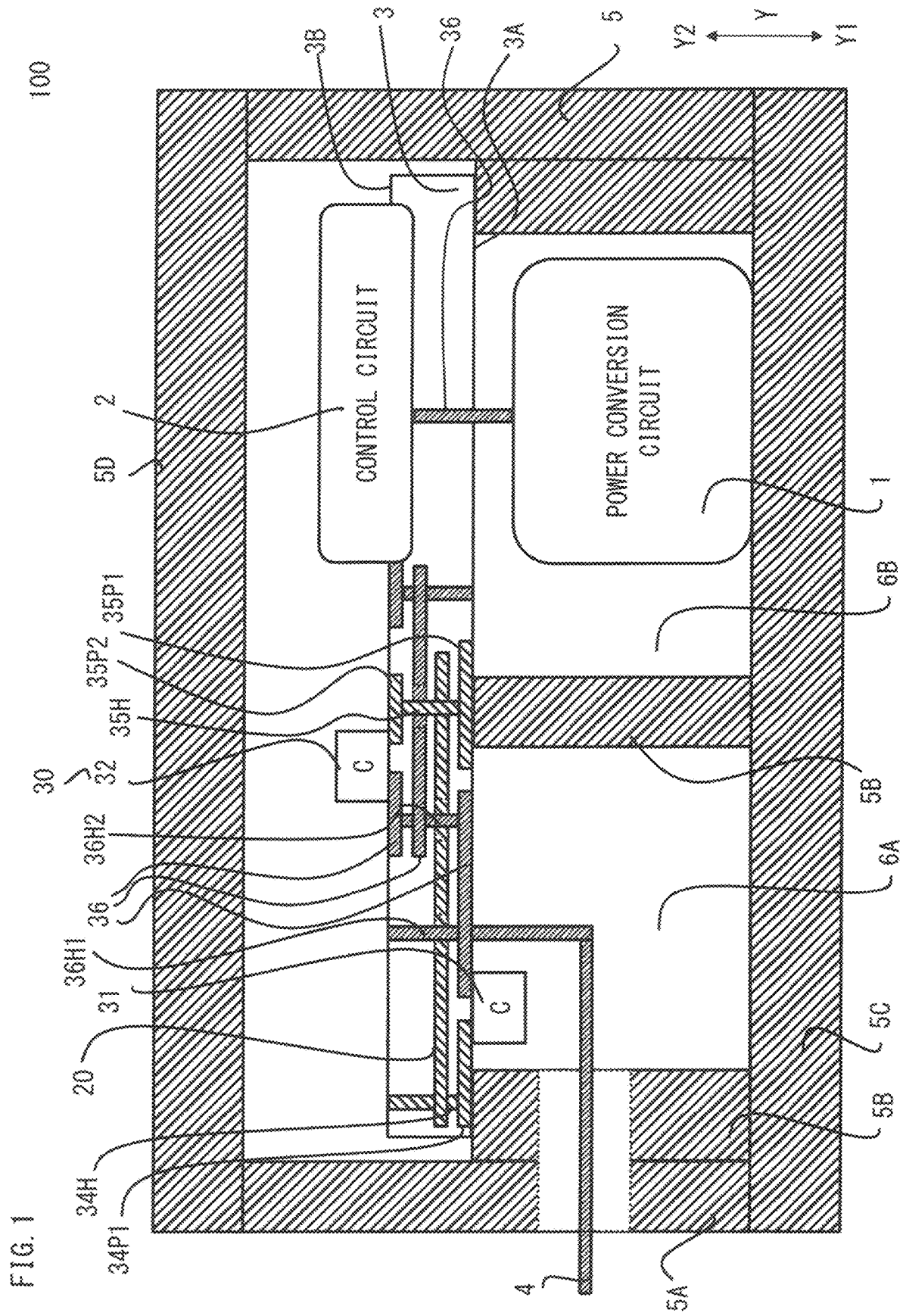
FIG. 1 is a cross-sectional view showing a schematic configuration of a power conversion device according to Embodiment 1.

FIG. 1 is a cross-sectional view showing a schematic configuration of a power conversion device 100 according to Embodiment 1.

The power conversion device 100 includes a power conversion circuit 1 which has semiconductor switching elements not shown and converts power, and a control circuit 2 which controls the power conversion circuit 1.

The power conversion device 100 further includes a first filter circuit 30 which suppresses electromagnetic noise in a control conductive path for controlling the control circuit 2, a printed board 3 on which the first filter circuit 30 is provided, and a conductive housing 5 which holds and incorporates the printed board 3 therein.

A wide surface that is a surface layer on one side in a thickness direction of the printed board 3 is referred to as a first main surface 3A, and a wide surface that is a surface layer of the printed board 3 on the side opposite to the first main surface 3A is referred to as a second main surface 3B.

The printed board 3 is a multilayer board having the first main surface 3A, the second main surface 3B, and one or more inner layers, and a ground pattern 20 as a reference potential pattern connected to the housing 5 is formed on the inner layer.

First ground pads 34P1 and 35P1 as connection pads are formed on the first main surface 3A of the printed board 3, and a second ground pad 35P2 as a connection pad is formed on the second main surface 3B. The first ground pads 34P1 and 35P1 and the second ground pad 35P2 on the surface layers of the printed board 3 are connected to the ground pattern 20 on the inner layer via through holes 34H and 35H as second connection holes which electrically connect wiring conductors on the respective layers of the printed board 3 to each other.

Next, the configuration of the housing 5 will be described.

Figure 2:
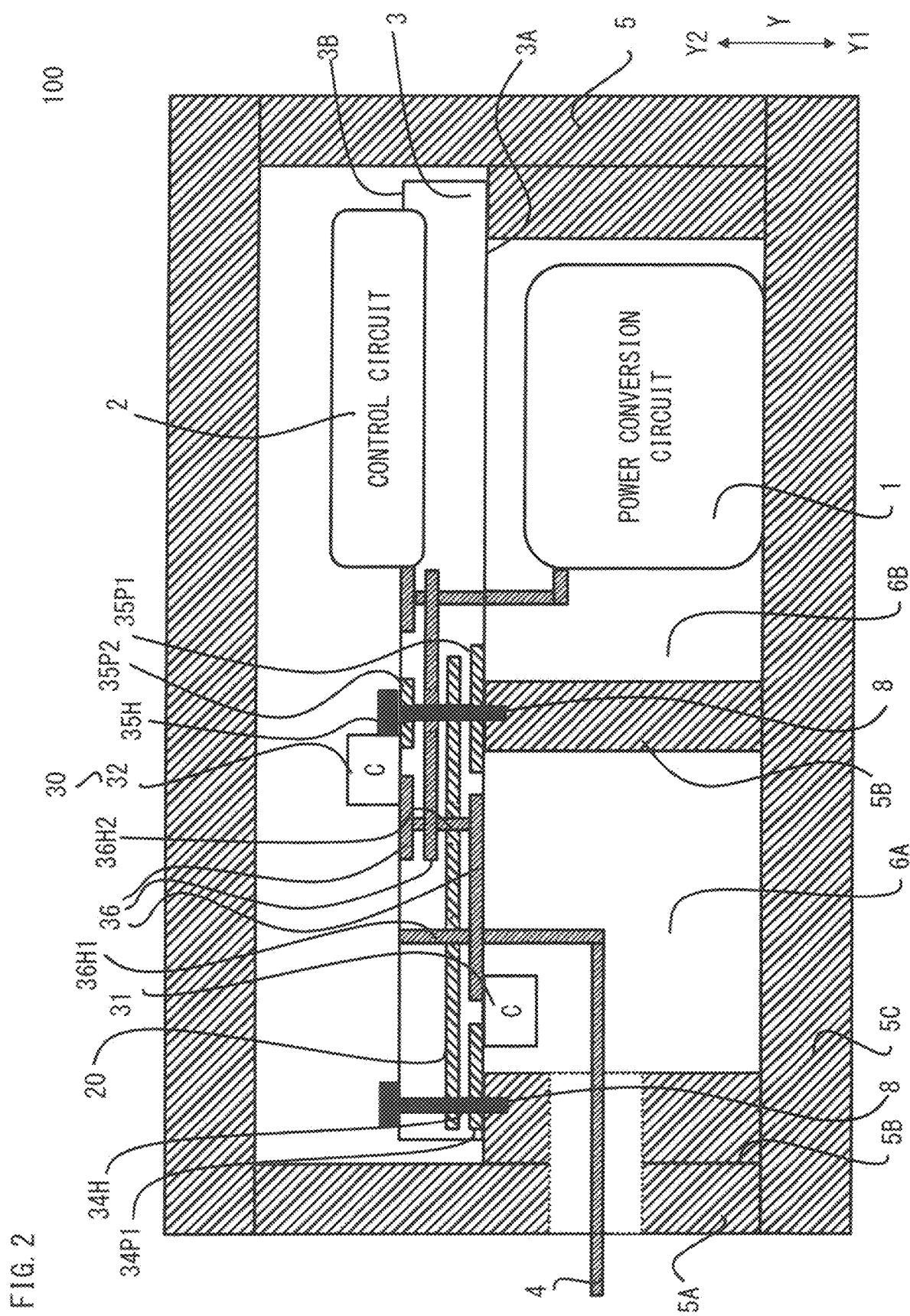
FIG. 2 is a cross-sectional view showing the schematic configuration of the power conversion device according to Embodiment 1.

FIG. 2 is a cross-sectional view showing a state where the printed board 3 is fixed by the housing 5 in the power conversion device 100 shown in FIG. 1.

The housing 5 has a conductive outer wall 5A which surrounds the printed board 3, a conductive housing wall 5B and bottom surface 5C as a shield wall which are provided on a downward direction side Y1 on the first main surface 3A side of the printed board 3, and a lid 5D. The bottom surface 5C is formed so as to be substantially parallel to the first main surface 3A of the printed board 3. The outer wall 5A extends from an end portion of the bottom surface 5C toward an upward direction 12 side and surrounds the printed board 3 from the lateral side. The housing wall 5B is provided on the inward side of the outer wall 5A, and extends from the bottom surface 5C toward the first main surface 3A side of the printed board 3, and an end portion on the upward direction 12 side thereof comes into contact with the first main surface 3A. The outer wall 5A and the housing wall 5B are electrically connected to the bottom surface 5C.

The space inside the housing 5 on the downward direction Y1 side of the printed board 3 is separated by the housing wall 5B into a shield region 6A as an electromagnetic shield region and another region 6B outside the shield region 6A. The first main surface 3A of the printed board 3 is located so as to face in the direction toward the shield region 6A, so that the upward direction Y2 side of the shield region 6A is covered with the printed board 3.

An end surface on the upward direction 12 side of the housing wall 5B is connected to the first ground pads 34P1 and 31B. The printed board 3 is fastened to the housing wall 5B at at least one or more locations by screws 8. At this time, the screws 8 penetrate the hollow portions of the through holes 34H and 35H which connect the ground pattern 20 and the first ground pads 34P1 and 35P1. Thus, the printed board 3 is fixed to the housing 5. The ground pattern 20 which is formed on the inner layer of the printed board 3 is electrically connected and grounded to the housing 5 via the first ground pads 34P1 and 35P1.

Accordingly, the shield region 6A, which is surrounded by the bottom surface 5C, the outer wall 5A, and the housing wall 53 of the housing 5, the ground pattern 20, the first ground pads 34P1 and 35P1, the through hole 34H connecting the first ground pad 34P1 and the ground pattern 20, and the through hole 35H connecting the first ground pad 35P1 and the ground pattern 20 and which shields electromagnetic waves from the outside, is formed.

Here, the shield region 6A includes not only a space region on the downward direction Y1 side of the first main surface 3A of the printed board 3 but also a region from the first main surface 3A to the ground pattern 20 in the printed board 3.

The material of the housing 5 is, for example, aluminum, iron, or a carbon fiber, but may be an insulator having a conductive paint applied to the surface thereof.

Outside the shield region 6A, the control circuit 2 which controls the power conversion circuit 1 is mounted on either one of or both the first main surface 3A and the second main surface 3B of the printed board 3. In the present embodiment, the control circuit 2 is mounted on the second main surface 3B side of the printed board 3.

Furthermore, the power conversion circuit 1 is disposed inside the region 6B which is outside the shield region 6A. Thus, components such as capacitors, coils, and power semiconductor switching elements, which are included in the power conversion circuit 1 and not shown are accommodated in the region 6B which is separated from the shield region 6A via the housing wall 5B. The components for the power conversion circuit 1 may be mounted directly on the printed board 3 as long as the components are located in the region outside the shield region 6A, or the components may be connected to the printed board 3 via wires.

The control circuit 2 operates on the basis of a control signal or a power supply voltage supplied from the outside of the power conversion device 100 via an external connection wire 4 as a control conductive path which is inserted from the outside of the power conversion device 100 into the shield region 6A and non-ground patterns 36 as a control conductive path which are formed on the printed board 3 and connected to the external connection wire 4.

The non-ground pattern 36 inside the shield region 6A and the non-ground pattern 36 outside the shield region 6A are connected via through holes 36H1 and 36H2 as a first connection hole which can connect wiring conductors between at least two layers of the printed board 3.

The non-ground patterns 36 and the ground pattern 20 need to be insulated such that the non-ground patterns 36 and the ground pattern 20 are not conductive to each other. Therefore, the through hole 36H1 which is penetrated by the external connection wire 4 and the through hole 36H2 which connects the non-ground pattern 36 inside the shield region 6A and the non-ground pattern 36 outside the shield region 6A need to pass through holes provided in the ground pattern 20. The ground pattern 20 can enhance the electromagnetic shielding effect within the shield region 6A by covering the shield region 6A without any gap, in the regions other than the holes (slits) through which the through holes 36H1 and 36H2 penetrated by the external connection wire 4 pass.

In the present embodiment, the configuration in which the external connection wire 4 penetrates the ground pattern 20 through the through hole 31H1 is shown. This assumes a terminal of a connector component which penetrates the printed board 3, or the like, as the external connection wire 4. For example, in the case where the external connection wire 4 is routed using a connector which is surface-mountable on the printed board 3, or the like, a configuration in which d through hole H1 penetrating the ground pattern 20 is not provided can be made.

The first filter circuit 30 suppresses electromagnetic noise, in the control conductive path, propagating from the control circuit 2 as described above, and has a first capacitor 31 and a second capacitor 32.

The first capacitor 31 is provided on the first main surface 3A of the printed board 3 in the shield region 6A. The first capacitor 31 is connected at a first end thereof to the non-ground pattern 36 in the shield region 6A, and connected and grounded at a second end thereof to the first ground pad 34P1.

The second capacitor 32 is provided on the second main surface 3B of the printed board 3 outside the shield region 6A. The second capacitor 32 is connected at a first end thereof to the non-ground pattern 36 outside the shield region 6A, and connected and grounded at a second end thereof to the second ground pad 35P2.

The through hole 36H1 penetrated by the external connection wire 4 may also serve as a via hole which connects the non-ground pattern 36 inside the shield region 6A and the non-ground pattern 36 outside the shield region 6A.

In the power conversion device 100 of the present embodiment, noise propagating from the control circuit 2 and the power conversion circuit 1 to the non-ground pattern 36 is bypassed to the housing 5 by the second capacitor 32 which is disposed outside the shield region 6A, whereby the noise is reduced.

When a noise current flows through the second capacitor 32, the second capacitor 32 generates a magnetic flux whose amount is proportional to the noise current, but the shield region 6A also functions to shield the magnetic flux generated by the second capacitor 32.

Furthermore, the non-ground pattern 36 outside the shield region 6A is led into the shield region 6A via the through hole 36H which is formed in the printed board 3, without using a wire such as a cable and a busbar. As described above, the non-ground pattern 36 outside the shield region 6A and the non-ground pattern 36 inside the shield region 6A are connected at the shortest distance via the printed board 3. Accordingly, the wire connecting from the outside of the shield region 6A to the inside of the shield region 6A is electromagnetically coupled from the outside of the shield space, whereby noise propagating into the shield space can be reduced.

Furthermore, a hole, a slit, or the like that has a large diameter and is for connecting the non-ground pattern 36 outside the shield region 6A and the non-ground pattern 36 inside the shield region 6A does not need to be provided in the housing wall, and thus noise leaking from a gap of the housing wall and propagating into the shield space can be prevented.

Furthermore, even if noise propagates into the shield space, the noise is bypassed to the housing 5 by the first capacitor 31 which is disposed inside the shield region 6A, whereby the noise is reduced.

Thus, it is possible to realize a power conversion device having high reliability by reducing conducted noise and radiated noise.

By electrically connecting the upper surface of the outer wall 5A to a conductive lid or the like, noise leaking from the power conversion circuit 1 and the control circuit 2 directly to the outside of the housing 5 as radio waves can be reduced in addition to noise propagating through the external connection wire 4. In this case, in addition to the housing wall 5B which is in contact with the printed board 3, there may be a housing wall that is not in contact with the printed board 3, and an upper surface of the housing wall that is not in contact with the printed board 3 may be connected to the lid.

The through hole 34H which connects the first ground pad 34P1 and the ground pattern 20 and the through hole 35H which connects the first ground pad 35P1 and the ground pattern 20 may be formed as through holes having the same axis, or may be formed as through holes having different axes.

The first ground pad 34P1 and the first ground pad 35P1 may be connected in the same layer of the printed board 3, or may be separated in the same layer of the printed board 3. It is sufficient that the first ground pad 34P1 and the first ground pad 35P1 are connected and grounded to the housing 5.

The through holes 34H, 35H, 36H1, and 36H2 are not limited to through holes that connect the wiring conductor on the first main surface and the wiring conductor on the second main surface, and may be via holes that can connect wiring conductors on at least two layers of the printed board 3.

The example in which the printed board 3 is fixed only to the housing wall 5B by screws is shown, but the printed board 3 may be fixed only to the outer wall 5A of the housing by screws, or may be fixed to both the outer wall 5A and the housing wall 5B by screws.

Hereinafter, power conversion devices 100a, 100b, 100c, 100d, 100e, and 100f which are modifications of the power conversion device 100 of the present embodiment will be described with reference to FIGS. 3 to 8.

Figure 3:
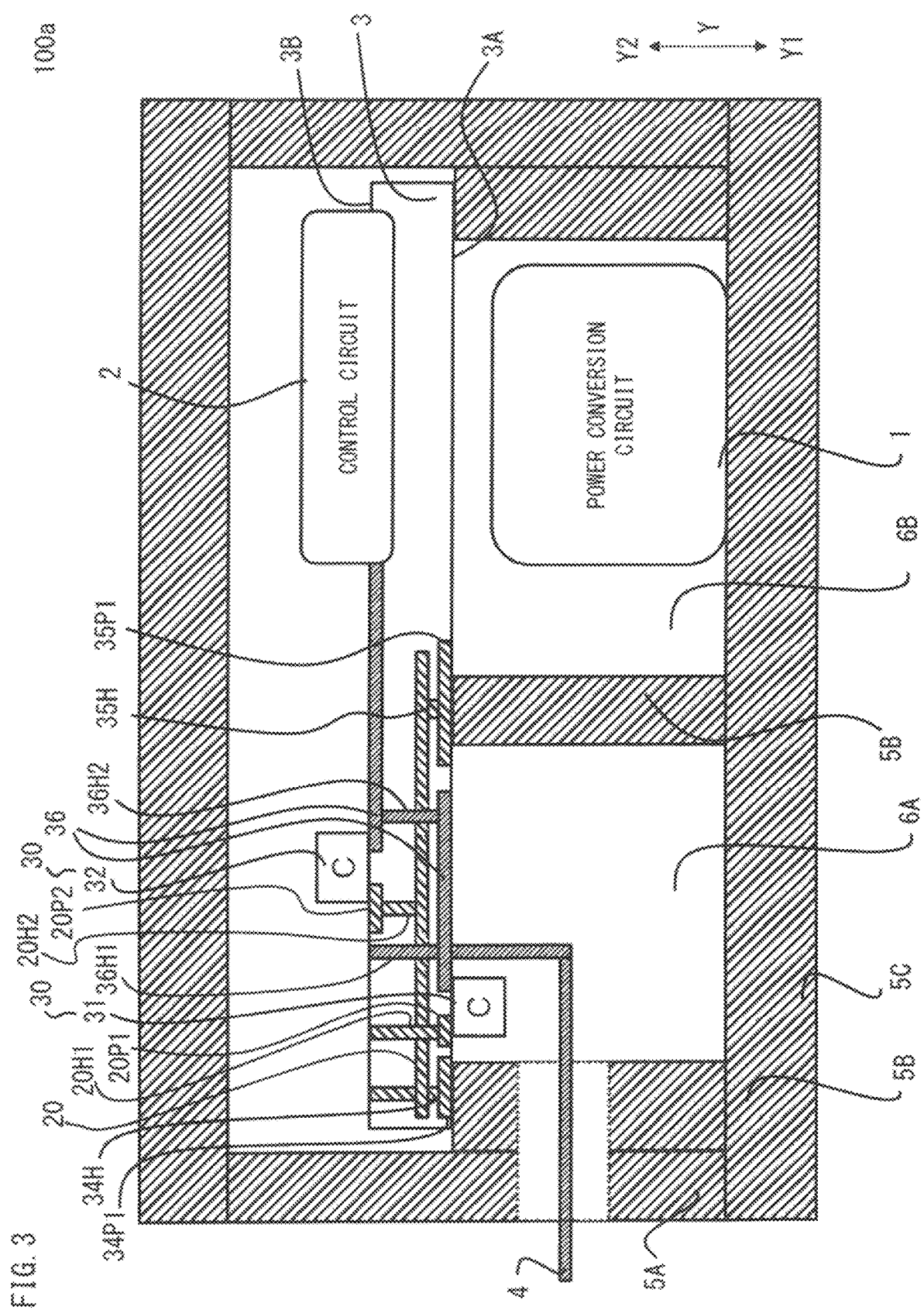
FIG. 3 is a cross-sectional view showing the schematic configuration of the power conversion device according to Embodiment 1.

FIG. 3 is a cross-sectional view showing a schematic configuration of the power conversion device 100a which is a modification of the power conversion device 100 according to Embodiment 1.

As shown in FIG. 3, the second end of the first capacitor 31 is not directly connected to the first ground pad 34P1, at the through hole 34H, which is directly grounded to the housing wall 5B, and may be connected and grounded to the ground pattern 20 via a via hole 20H1. Similarly, the second end of the second capacitor 32 is not directly connected to the first ground pad 35P1, at the through hole 35H, which is directly grounded to the housing wall 5B, and may be connected and grounded to the ground pattern 20 via a via hole 20H2.

As shown in FIG. 3, the via hole 20H2 which connects a second ground pad 20P2 and the ground pattern 20 and the via hole 20H1 which connects a first ground pad 20P1 and the ground pattern 20 may be separately formed as long as these via holes are connected via the ground pattern 20.

Figure 4:
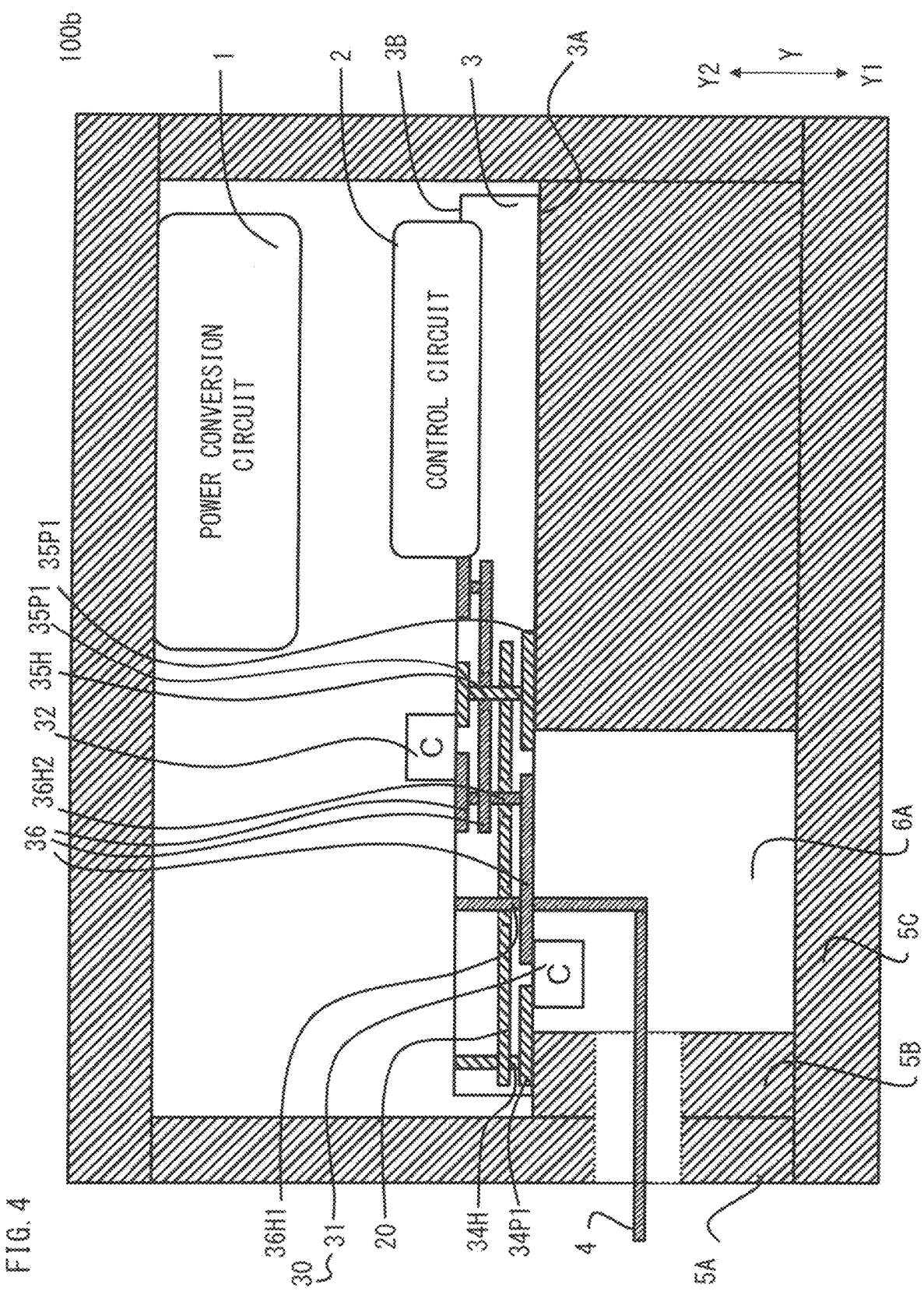
FIG. 4 is a cross-sectional view showing the schematic configuration of the power conversion device according to Embodiment 1.

FIG. 4 is a cross-sectional view showing a schematic configuration of the power conversion device 100b which is a modification of the power conversion device 100 according to Embodiment 1.

In this power conversion device 100b, the power conversion circuit 1 may be disposed so as to face the second main surface 3B of the printed board 3. In this case, the housing wall 5B does not need to demarcate the region 6B shown in Embodiment 1 which accommodates the power conversion circuit 1 therein, and a part or the entirety of the housing wall 5B may also serve as the outer wall 5A.

Figure 5:
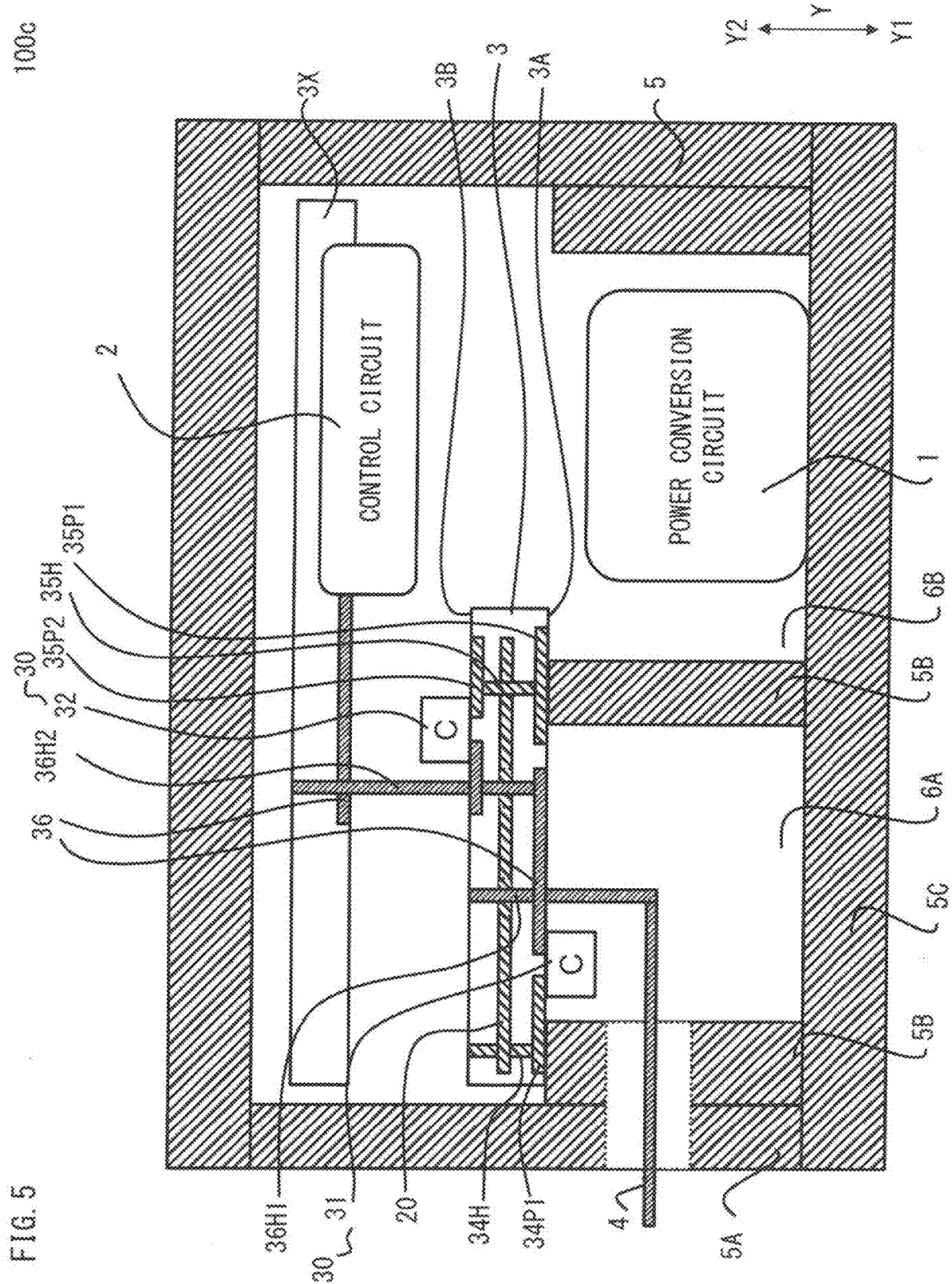
FIG. 5 is a cross-sectional view showing the schematic configuration of the power conversion device according to Embodiment 1.

FIG. 5 is a cross-sectional view showing a schematic configuration of the power conversion device 100c which is a modification of the power conversion device 100 according to Embodiment 1.

As shown in FIG. 5, a printed board 3X on which the control circuit 2 is mounted and the printed board 3 on which the first filter circuit 30 is mounted may be separately formed. In this case, the printed boards 3 and 3X are connected to each other by a cable, a connector, or the like.

Figure 6:
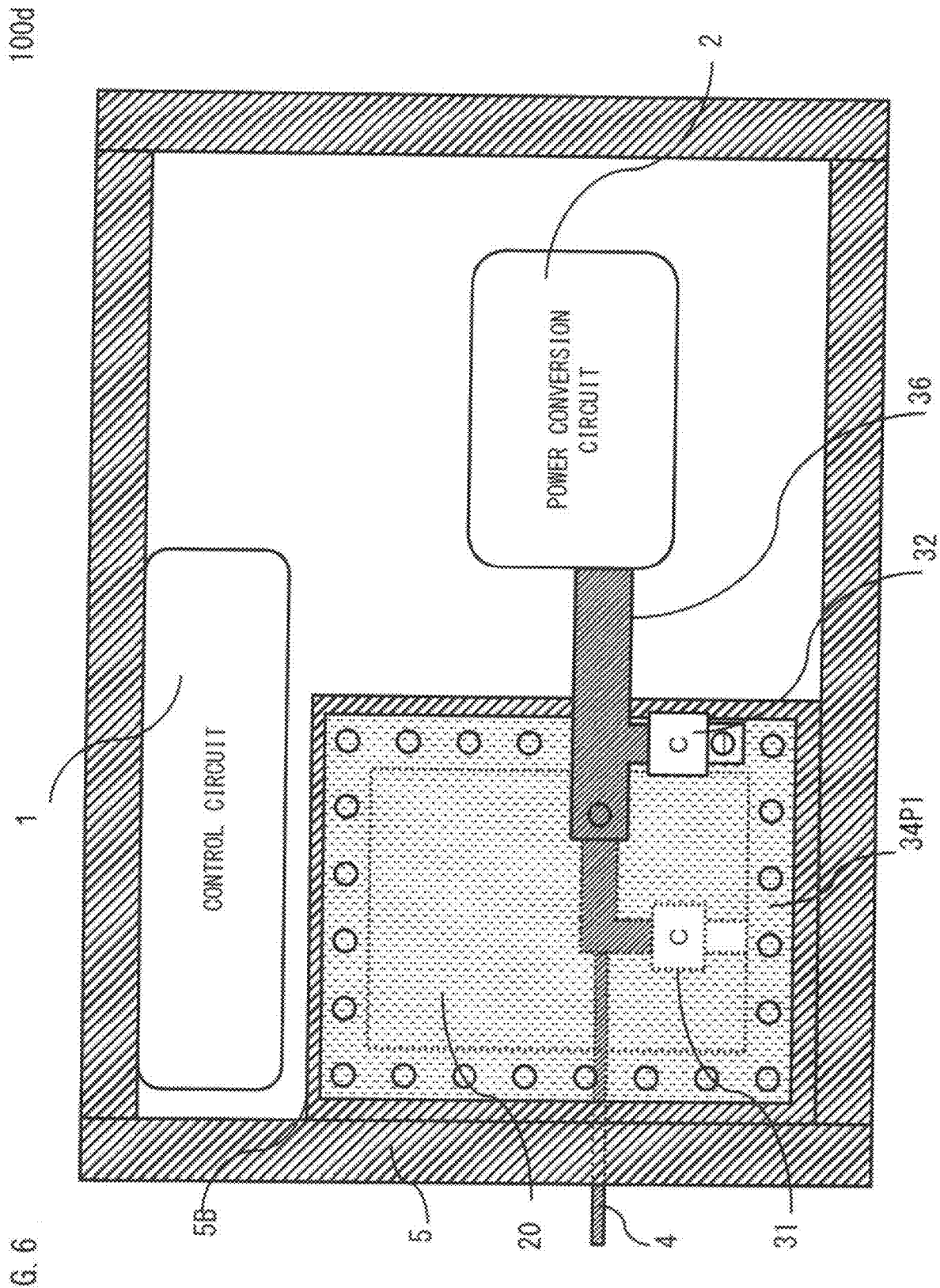
FIG. 6 is a top view showing the schematic configuration of the power conversion device according to Embodiment 1.

FIG. 6 is a top view showing a schematic configuration of the power conversion device 100d which is a modification of the power conversion device 100 according to Embodiment 1.

This drawing is a view as seen from the second main surface 3B side of the printed board 3, and the contour of the printed board 3 is not shown therein. The pattern and capacitor shown by dashed lines are located on the downward direction Y1 side with respect to the ground pattern 20. The first ground pad 34P1 is formed on a part or the entire surface of a portion where the ground pattern 20 and the housing wall 59 overlap. Even if the power conversion circuit 1 is mounted on the same board as the filter circuit and noise caused by the power conversion circuit 1 is large, noise caused by electromagnetic coupling can be reduced by reliably ensuring the portion (region) where the ground pattern 20 and the housing wall 5B overlap.

Figure 7:
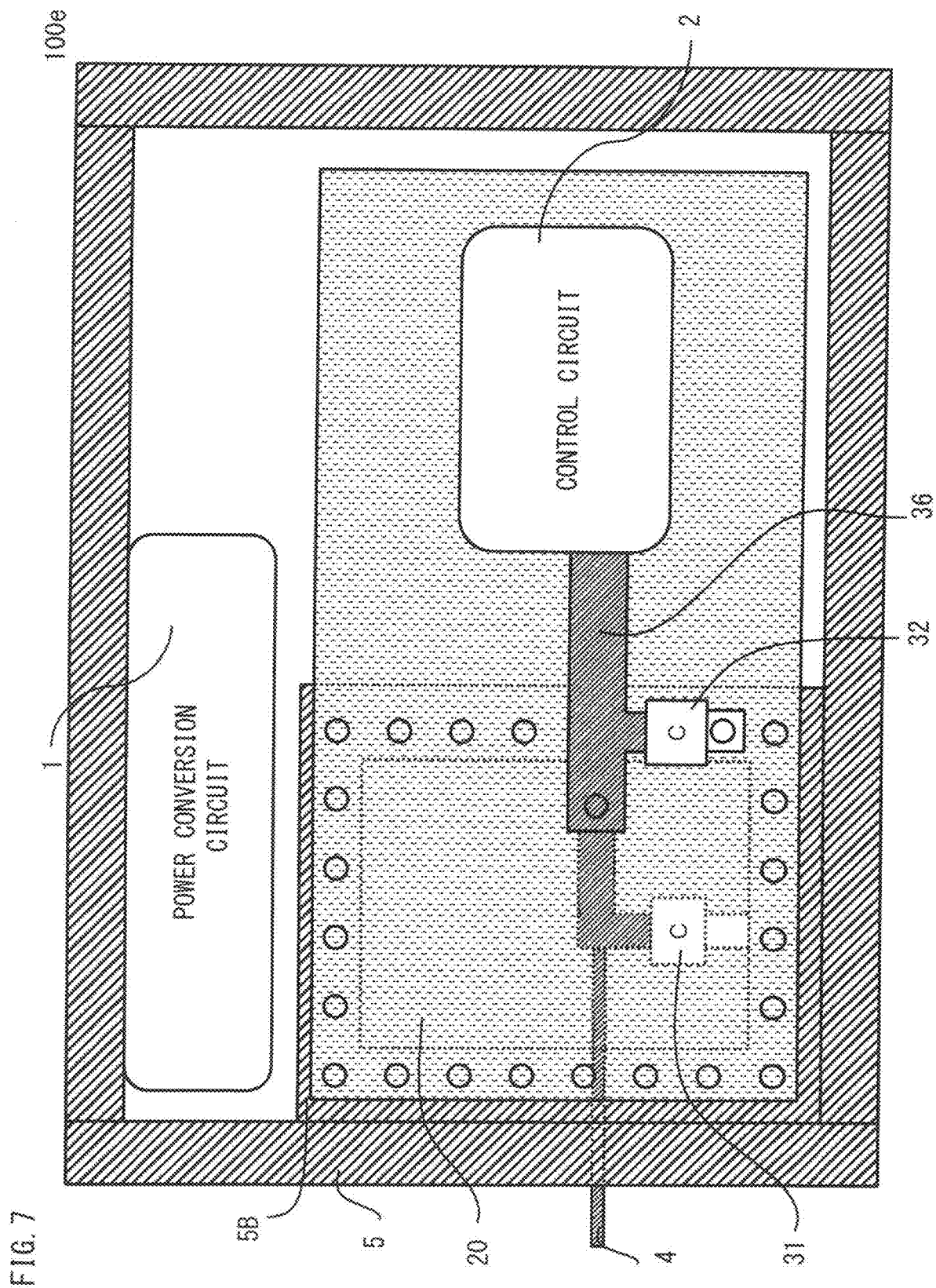
FIG. 7 is a top view showing the schematic configuration of the power conversion device according to Embodiment 1.

FIG. 7 is a top view showing a schematic configuration of the power conversion device 100e which is a modification of the power conversion device 100 according to Embodiment 1.

As shown in FIG. 7, the control circuit 2 may operate on the basis of the potential of the ground pattern 20, and the ground pattern 20 may extend to the position at which the control circuit 2 is mounted. By configuring the second capacitor 32 such that the second capacitor 32 is located directly above the housing wall 5B, a noise current can be caused to smoothly flow to the housing.

Figure 8:
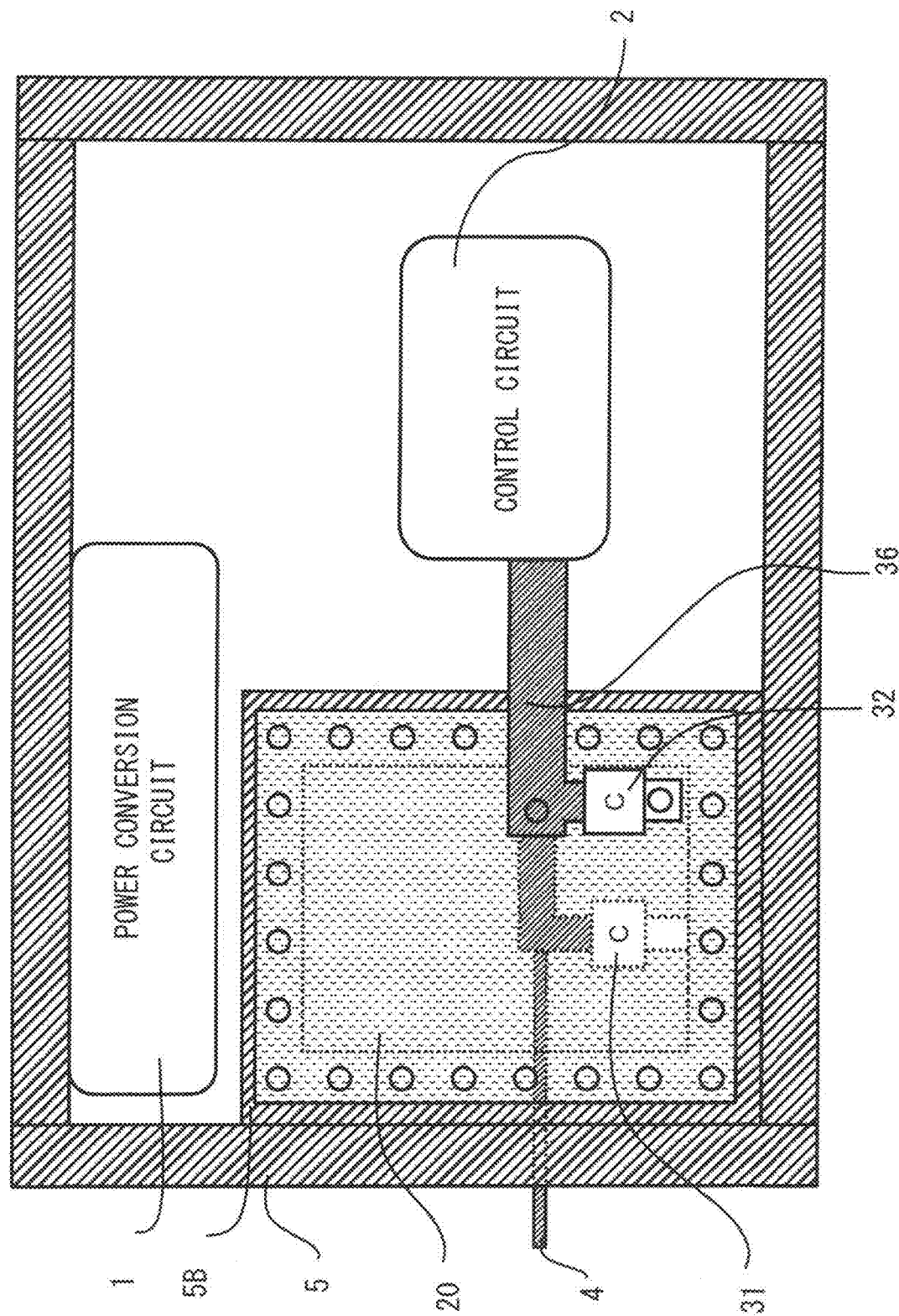
FIG. 8 is a top view showing the schematic configuration of the power conversion device according to Embodiment 1.

FIG. 8 is a top view showing a schematic configuration of the power conversion device 100f which is a modification of the power conversion device 100 according to Embodiment 1.

FIG. 8 shows a top view of the power conversion device according to the modification of Embodiment 1. As shown, the second capacitor 32 does not necessarily have to be located directly above the housing wall 5B.

The power conversion device of the present embodiment configured as described above is a power conversion device including a power conversion circuit which converts power and a control circuit which controls the power conversion circuit, the power conversion device including:

a filter circuit which is connected to a control conductive path fox controlling at least either the control circuit or the power conversion circuit and suppresses electromagnetic noise in the control conductive path;

a circuit wiring board which is a printed board on which the filter circuit is provided and in which a reference potential pattern is formed on an inner layer; and a housing which holds the circuit wiring board, wherein the reference potential pattern is connected to the housing, the housing has a shield wall which is provided at a side of a first main surface which is a surface layer on one side in a thickness direction of the circuit wiring board, an electromagnetic shield region which is surrounded by the shield wall and the reference potential pattern is formed in the housing, and the control circuit and the power conversion circuit are provided outside the electromagnetic shield region, the control conductive path is wired into the electromagnetic shield region so as to be led from the control circuit into the electromagnetic shield region via a first connection hole which connects wiring conductors on at least two layers of the circuit wiring board, and the filter circuit has
  a first capacitor which is provided inside the electromagnetic shield region of the circuit wiring board, connected at a first end thereof to the control conductive path inside the electromagnetic shield region, and connected at a second end thereof to the reference potential pattern, and
  a second capacitor which is provided outside the electromagnetic shield region of the circuit wiring board, connected at a first end thereof to the control conductive path, and connected at a second end thereof to the reference potential pattern.

As described above, noise propagating from the control circuit and the power conversion circuit to the control conductive path is reduced by the second capacitor which is disposed outside the shield space. Thus, by reducing the noise in the vicinity of the control circuit and the power conversion circuit which are noise sources, noise propagating through a cable can be effectively reduced.

Furthermore, by providing the first capacitor bypassed to the housing in the electromagnetic shield region, even if noise is propagated into the shield space, noise propagating through the cable can be suppressed in a state where a magnetic flux around the first capacitor is shielded. Accordingly, a further noise reduction effect can be achieved.

The control conductive path is led into the electromagnetic shield region via the first connection hole which is formed in the printed board, without using a wire such as a cable and a busbar.

As described above, as for the first connection hole which is formed in the printed board, a thin copper plating or the like is provided on the inner wall of the first connection hole, the need for insertion of a conductive wire such as a cable and a busbar is eliminated, and layers of the printed board can be reliably electrically connected while a small diameter of the first connection hole is ensured. With the configuration using the first connection hole formed in the printed board so as to have a smaller diameter than a hole provided in a housing such as a metal plate as described above, propagation of noise from the outside of the electromagnetic shield region to the inside of the electromagnetic shield region can be effectively suppressed.

Furthermore, the clearance between the first connection hole which serves as the control conductive path and is formed in the circuit wiring board and the ground pattern which is formed at a set distance from the first connection hole so as to surround the first connection hole and functions as a shield can be smaller than a clearance that is the gap between the inner wall of a hole formed in a general housing and a conductive wire inserted into this hole.

Since the clearance between the first connection hole which serves as the control conductive path and the ground pattern which functions as a shield can be smaller as described above, the electromagnetic shielding effect can be further improved.

The control conductive path outside the electromagnetic shield region is led into the electromagnetic shield region through connection at the shortest distance equal to the thickness of the printed board by the first connection hole which is formed in the circuit wiring board. Furthermore, by making a connection via the first connection hole of the printed board, the wire length, path, etc., of the control conductive path from the outside of the electromagnetic shield region to the inside of the electromagnetic shield region can be made uniform.

Thus, the wire connecting from the outside of the shield region to the inside of the shield region is electromagnetically coupled from the outside of the shield space, whereby noise propagating to the inside of the shield space can be further reduced. In addition, a noise change depending on a change in the wire length, path, etc., of the control conductive path is suppressed, whereby the reliability can be further improved. Thus, it is possible to realize a power conversion device in which conducted noise and radiated noise are reduced and which has high reliability.

Since the electromagnetic shield region is formed by using the reference potential pattern which is formed on the inner layer of the circuit wiring board, it is possible to realize a small-sized and lightweight power conversion device.

Moreover, in the power conversion device of the present embodiment configured as described above,
  the reference potential pattern is connected to the housing via a second connection hole which connects the reference potential pattern and a wiring conductor on the first main surface of the circuit wiring board, and
  the electromagnetic shield region is further surrounded by the second connection hole in addition to the shield wall and the reference potential pattern.

By forming the electromagnetic shield region by using the second connection hole which connects the reference potential pattern and the wiring conductor on the first main surface as described above, the electromagnetic shield region can be formed so as to have no gap. Accordingly, noise leakage can be prevented and the electromagnetic shielding effect within the electromagnetic shield region can be improved.

Moreover, in the power conversion device of the present embodiment configured as described above,
  the first connection hole is a through hole which connects the wiring conductor on the first main surface and a wiring conductor on a second main surface which is a surface layer on a side opposite to the first main surface, or a via hole which connects wiring conductors on at least two layers of the circuit wiring board.

As described above, the control conductive path is led into the electromagnetic shield region via the via hole or the through hole which is formed in the printed board, without using a wire such as a cable and a busbar. By using the via hole or the through hole having a smaller diameter than a hole provided in a housing such as a metal plate as described above, propagation of noise to the inside of the shield region can be effectively suppressed.

Furthermore, since the clearance between the via hole or the through hole which serves as the control conductive path and the ground pattern which is formed around the via hole or the through hole and functions as a shield can be smaller, the electromagnetic shielding effect can be further improved.

Moreover, the control conductive path outside the electromagnetic shield region and the control conductive path inside the electromagnetic shield region can be connected at the shortest distance equal to the thickness of the printed board, and the wire length, path, etc., of the control conductive path from the outside of the electromagnetic shield region to the inside of the electromagnetic shield region can be made uniform by using the via hole or the through hole in the printed board. Thus, it is possible to provide a power conversion device that suppresses a noise change depending on a change in the wire length, path, etc., and has high reliability.

Moreover, in the power conversion device of the present embodiment configured as described above,
the reference potential pattern is connected to the housing via the second connection hole and a connection pad which is formed on a contact portion, in the first main surface, between the second connection hole and the shield wall of the housing.

Moreover, in the power conversion device of the present embodiment configured as described above,
the shield wall of the housing is formed so as to have a housing bottom portion which is formed so as to be parallel to the first main surface of the circuit wiring board, and a housing wall portion which extends from the housing bottom portion toward the first main surface side of the circuit wiring board and comes into contact with the first main surface, and
the connection pad is formed on a contact portion, in the first main surface, between the housing wall portion and the first main surface.

Since the second connection hole connected to the reference potential pattern is in contact with the housing as described above, the impedance of the reference potential pattern can be decreased, and the shielding effect in the electromagnetic shield region can be improved. In addition, by strengthening the electrical connection between the housing and the second connection hole by the connection pad, the shielding effect in the electromagnetic shield region can be further improved.

Thus, it is possible to provide a small-sized and light-weight power conversion device having smaller noise than a conventional power conversion device, by providing the shield space using the printed board, and suppressing propagation of noise to the inside of the shield space.

Embodiment 2

Hereinafter, Embodiment 2 of the present disclosure will be described with reference to the drawing, focusing on differences from Embodiment 1 described above. The same portions as those in Embodiment 1 described above are denoted by the same reference characters, and the description thereof is omitted.

Figure 9:
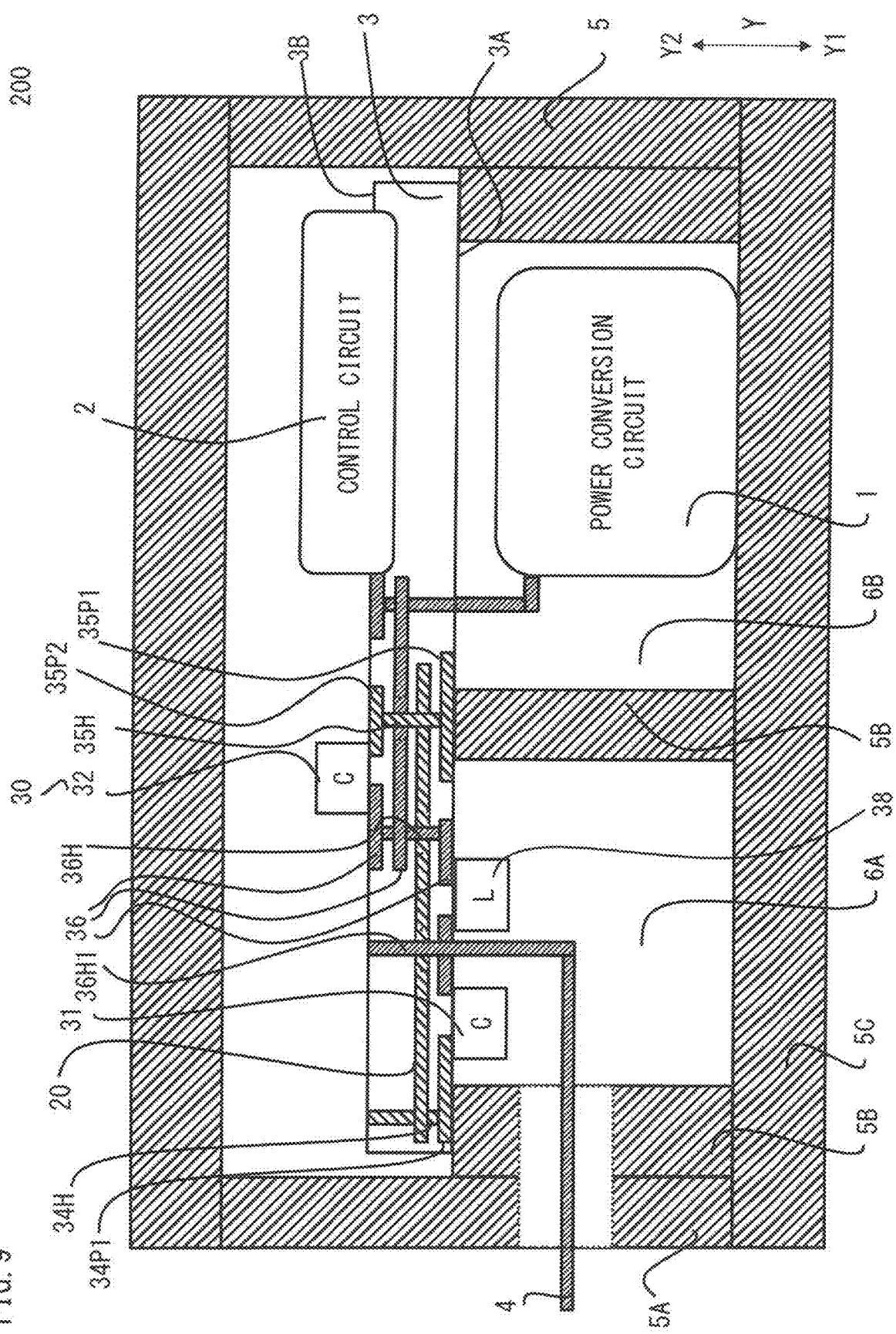
FIG. 9 is a cross-sectional view showing a schematic configuration of a power conversion device according to Embodiment 2.

FIG. 9 is a cross-sectional view showing a schematic configuration of a power conversion device 200 according to Embodiment 2.

The power conversion device 200 according to Embodiment 2 basically has the same configuration as the power conversion device 100 according to Embodiment 1, but is different therefrom in that an inductor 38 is provided in series with the non-ground pattern 36 connecting the first capacitor 31 and the second capacitor 32.

The inductor 38 is mounted on the first main surface 3A of the printed board 3 inside the shield region 6A. A combination of the inductor 38 and the first capacitor 31 constitutes an LC filter, and can improve the effect of reducing noise propagating to the outside of the power conversion device 100 via the external connection wire 4. The inductor 38 may be a hollow magnetic material through which a conductor penetrates, or a coil having a winding on a magnetic material. In the case where the inductor 38 is mounted outside the shield region 6A, the inductor 38 may be electromagnetically coupled from the power conversion circuit, resulting in an increase in noise. However, by mounting the inductor 38 inside the shield region 6A, an increase in noise can be prevented.

The power conversion device of the present embodiment configured as described above includes
an inductor which is connected in series with the control conductive path between the second end of the first capacitor and the second end of the second capacitor and disposed inside the electromagnetic shield region on the first main surface of the circuit wiring board.

As described above, by providing an inductor inside the shield region, it is possible to provide a power conversion device that further reduces noise and has high reliability.

Embodiment 3

Hereinafter, Embodiment 3 of the present disclosure will be described with reference to the drawing, focusing on differences from Embodiments 1 and 2 described above. The same portions as those in Embodiment 1 described above are denoted by the same reference characters, and the description thereof is omitted.

Figure 10:
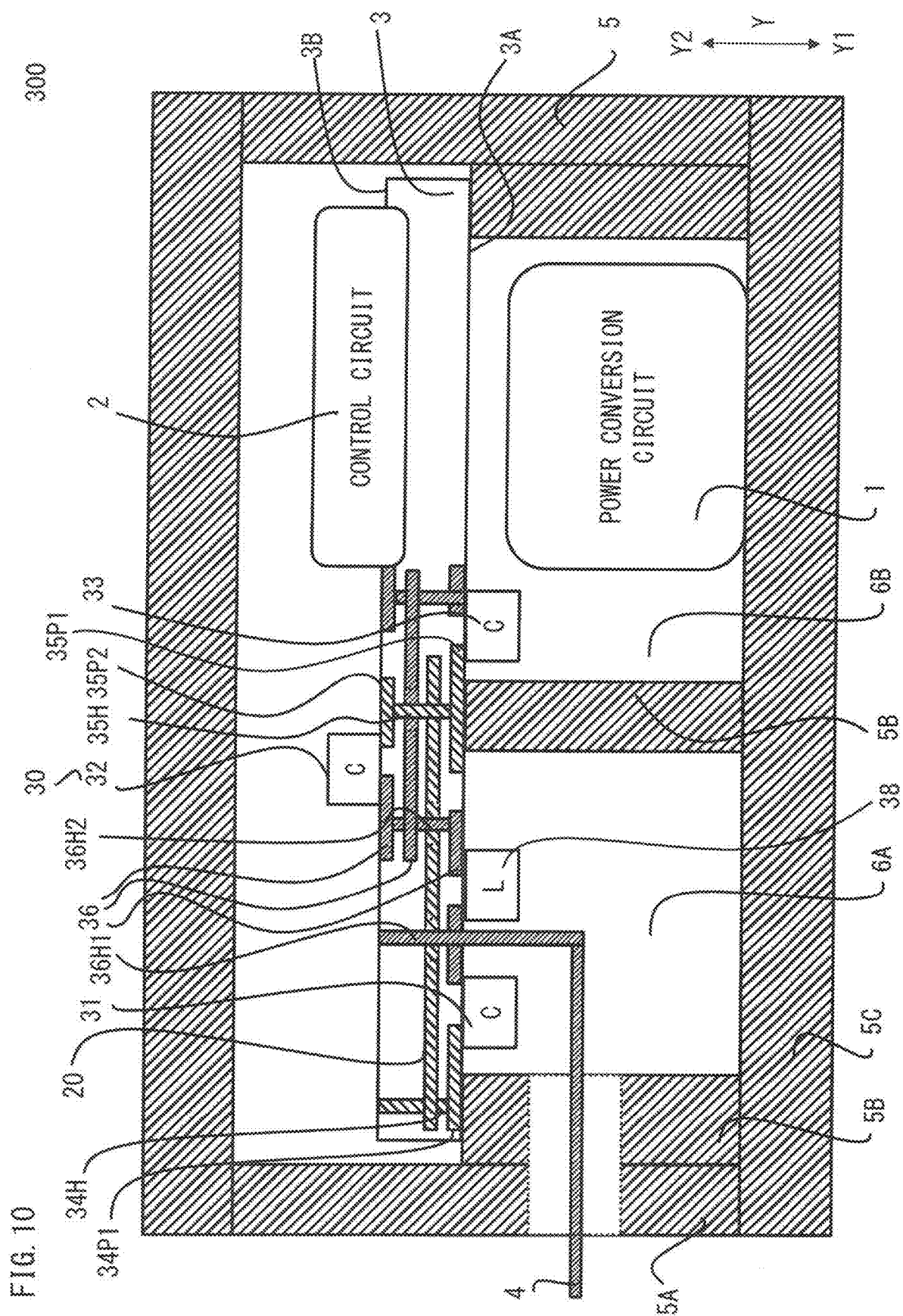
FIG. 10 is a cross-sectional view showing a schematic configuration of a power conversion device according to Embodiment 3.

FIG. 10 is a cross-sectional view showing a schematic configuration of a power conversion device 300 according to Embodiment 3.

The power conversion device 300 according to Embodiment 3 basically has the same configuration as the power conversion device 200 according to Embodiment 2, but is different therefrom in that a second capacitor 33 is further mounted on the first main surface 3A of the printed board 3 which faces the region 6B in which the power conversion circuit 1 is accommodated, outside the shield region 6A. Accordingly, noise coupled from the power conversion circuit 1 is bypassed to the housing 5 in the vicinity of the power conversion circuit 1 by the second capacitor 33, whereby noise current flowing through the non-ground pattern 36 is reduced, and the noise reduction effect is improved.

In the power conversion device of the present embodiment configured as described above,
the power conversion circuit is provided on either the first main surface of the circuit wiring board outside the electromagnetic shield region or a second main surface which is a surface layer on a side opposite to the first main surface,
a plurality of the second capacitors are provided, and
at least one of the second capacitors is disposed on the first main surface or the second main surface on a side on which the power conversion circuit is provided, is connected at the first end thereof to the control conductive path for controlling the power conversion circuit, and is connected at the second end thereof to the reference potential pattern.

As described above, by providing the second capacitor in the housing in the vicinity of the power conversion circuit 1 which is a noise source, it is possible to provide a power conversion device that further reduces noise and has high reliability.

Embodiment 4

Hereinafter, Embodiment 4 of the present disclosure will be described with reference to the drawings, focusing on differences from Embodiment 1 described above. The same portions as those in Embodiment 1 described above are denoted by the same reference characters, and the description thereof is omitted.

Figure 11:
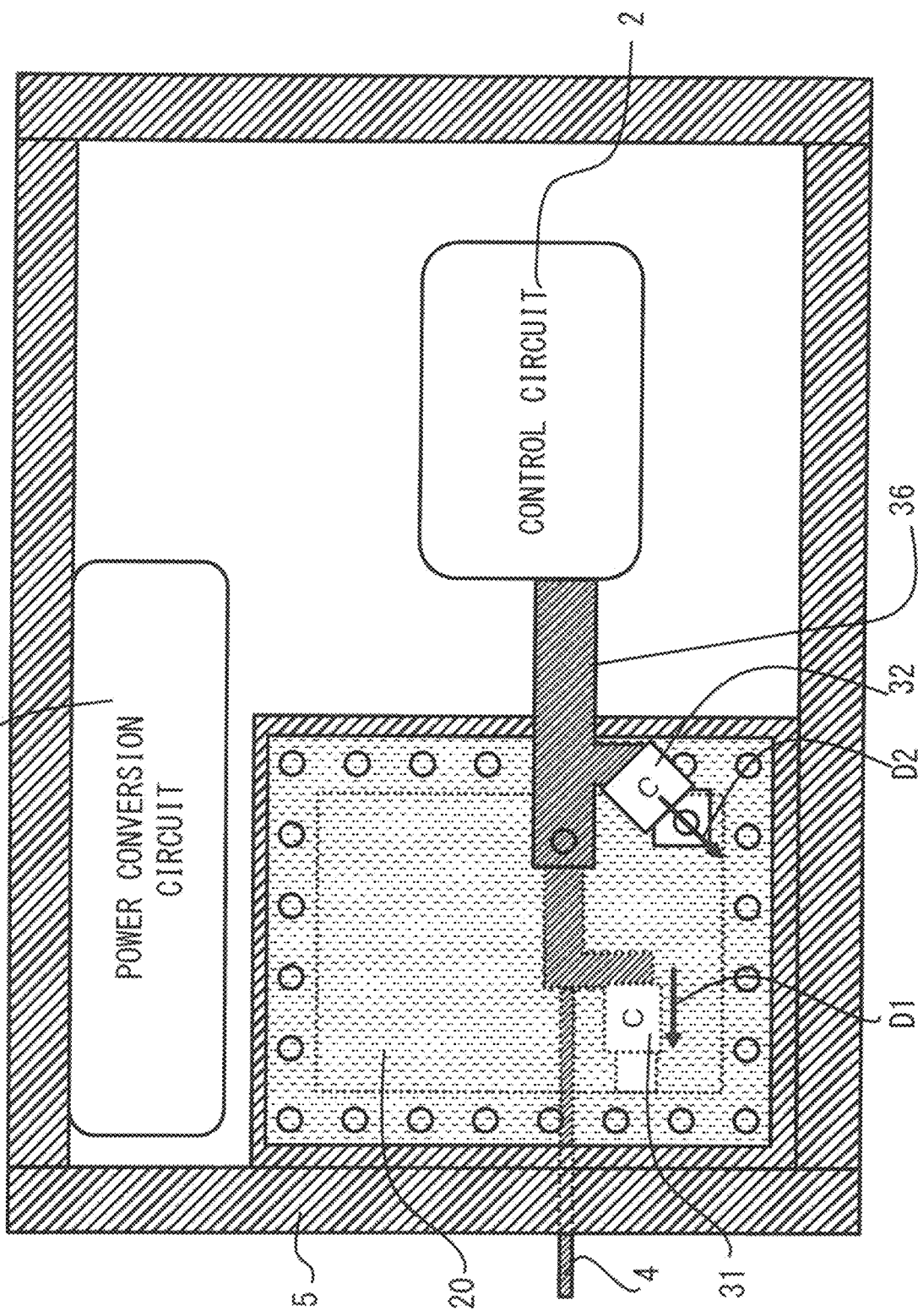
FIG. 11 is a top view showing a schematic configuration of a power conversion device according to Embodiment 4.

FIG. 11 is a top view showing a schematic configuration of a power conversion device 400 according to Embodiment 4.

In the drawing, the components and patterns mounted and wired on the inner layer or first main surface 3A side of the printed board 3 are shown by dotted lines.

The power conversion device 400 according to Embodiment 4 basically has the same configuration as the power conversion device 100 according to Embodiment 1, but is different therefrom in that the first capacitor 31 and the second capacitor 32 are mounted such that a direction D1 from the first end toward the second end of the first capacitor 31 is directed so as to be different by 45 degrees from a direction D2 from the first end toward the second end of the second capacitor 32.

When a noise current flows through the second capacitor 32, the second capacitor 32 generates a magnetic flux whose amount is proportional to the noise current. The shield region 6A also functions to shield this magnetic flux, but at frequencies at which the thickness of the ground pattern 20 is not greater than the surface depth of the conductive material of the pattern, a part of the magnetic flux enters the shield region 6A, and the magnetic flux that has entered interlinks with the first capacitor 31, thereby causing a problem that noise propagating from the external connection wire 4 to the device outside is increased.

For example, whereas the surface depth of copper is 209 μm at 100 kHz, 66 μm at 1 MHz, and 21 μm at 10 MHz, the thickness of a pattern is usually about 18 μm, and the thickness of a thick pattern is about 100 μm. Therefore, noise of 100 kHz to 10 MHz enters the shield region 6A. Thus, it may be insufficient to simply form a part of the shield region 6A by using the ground pattern 20, and a magnetic flux that interlinks with the first capacitor 31, of the magnetic flux that enters the shield region 6A, can be reduced to $1/\sqrt{2}$ by mounting the first capacitor 31 and the second capacitor 32 such that the directions thereof are different from each other by 45 degrees as in the present embodiment. Even in the case where the angle formed between the first capacitor 31 and the second capacitor 32 is 135 degrees, the same effect can be achieved, so that it is sufficient that the first capacitor 31 and the second capacitor 32 are disposed such that this angle is in a range of not less than 45 degrees and not greater than 135 degrees.

Figure 12:
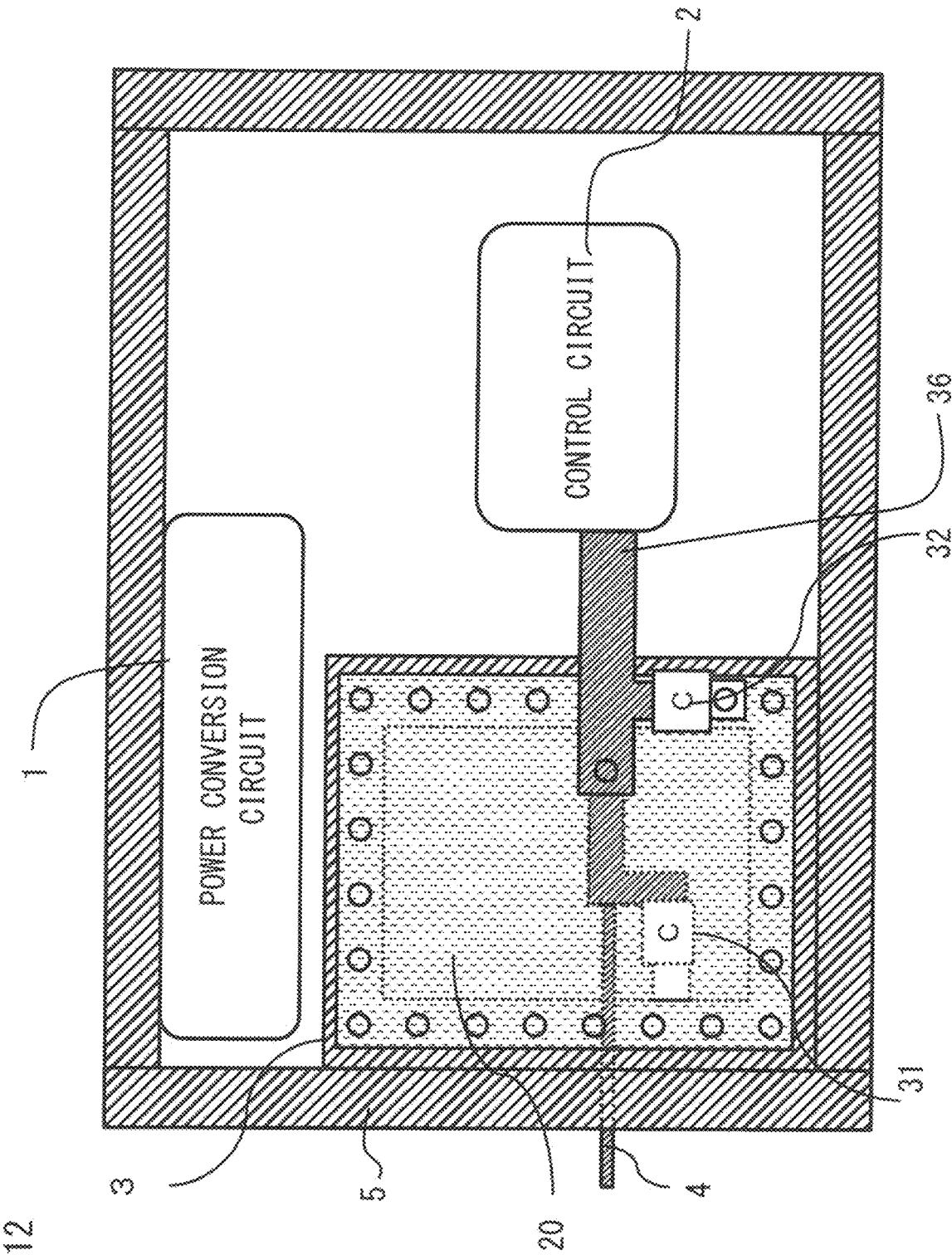
FIG. 12 is a top view showing the schematic configuration of the power conversion device according to Embodiment 4.

FIG. 12 shows a top view of a power conversion device 400a according to a modification of Embodiment 4. As shown, preferably, the direction from the first end toward the second end of the first capacitor 31 and the direction from the first end toward the second end of the second capacitor 32 are orthogonal to each other. In this case, the magnetic flux that interlinks with the first capacitor 31 can be reduced the most. In the power conversion device 400 shown in the present embodiment, even if a magnetic flux enters the shield region 6A, an increase in noise can be prevented.

The frequency of noise that enters the shield region 6A may be assumed on the basis of the conductor thickness of the ground pattern 20 in the thickness direction of the printed board 3 and the surface depth at the frequency of a noise signal flowing through the ground pattern 20, and the magnetic flux that interlinks with the first capacitor 31 may be adjusted by adjusting the angle formed between the direction from the first end toward the second end of the first capacitor 31 and the direction from the first end toward the second end of the second capacitor 32 in accordance with the noise that has entered.

In the power conversion device of the present embodiment configured as described above,
the first capacitor and the second capacitor are disposed such that a direction from the first end toward the second end of the first capacitor forms an angle not less than 45 degrees and not greater than 135 degrees, with respect to a direction from the first end toward the second end of the second capacitor, as seen in a direction orthogonal to the first main surface.

By adjusting the angle formed between the first capacitor and the second capacitor as described above, the magnetic flux that interlinks with the first capacitor 31, of the magnetic flux that enters the shield space, can be reduced, so that it is possible to provide a power conversion device that further improves the noise reduction effect and has high reliability.

Moreover, in the power conversion device of the present embodiment configured as described above,
the angle is adjusted on the basis of a conductor thickness of the reference potential pattern in the thickness direction of the circuit wiring board and a surface depth at a frequency of a signal flowing through the reference potential pattern.

By adjusting the magnetic flux that interlinks with the first capacitor 31, on the basis of the conductor thickness of the ground pattern 20 in the thickness direction of the printed board 3 and the surface depth at the frequency of the noise signal flowing through the ground pattern 20 as described above, the noise reduction effect can be further improved.

Embodiment 5

Hereinafter, Embodiment 5 of the present disclosure will be described with reference to the drawing, focusing on differences from Embodiment 1 described above. The same portions as those in Embodiment 1 described above are denoted by the same reference characters, and the description thereof is omitted.

Figure 13:
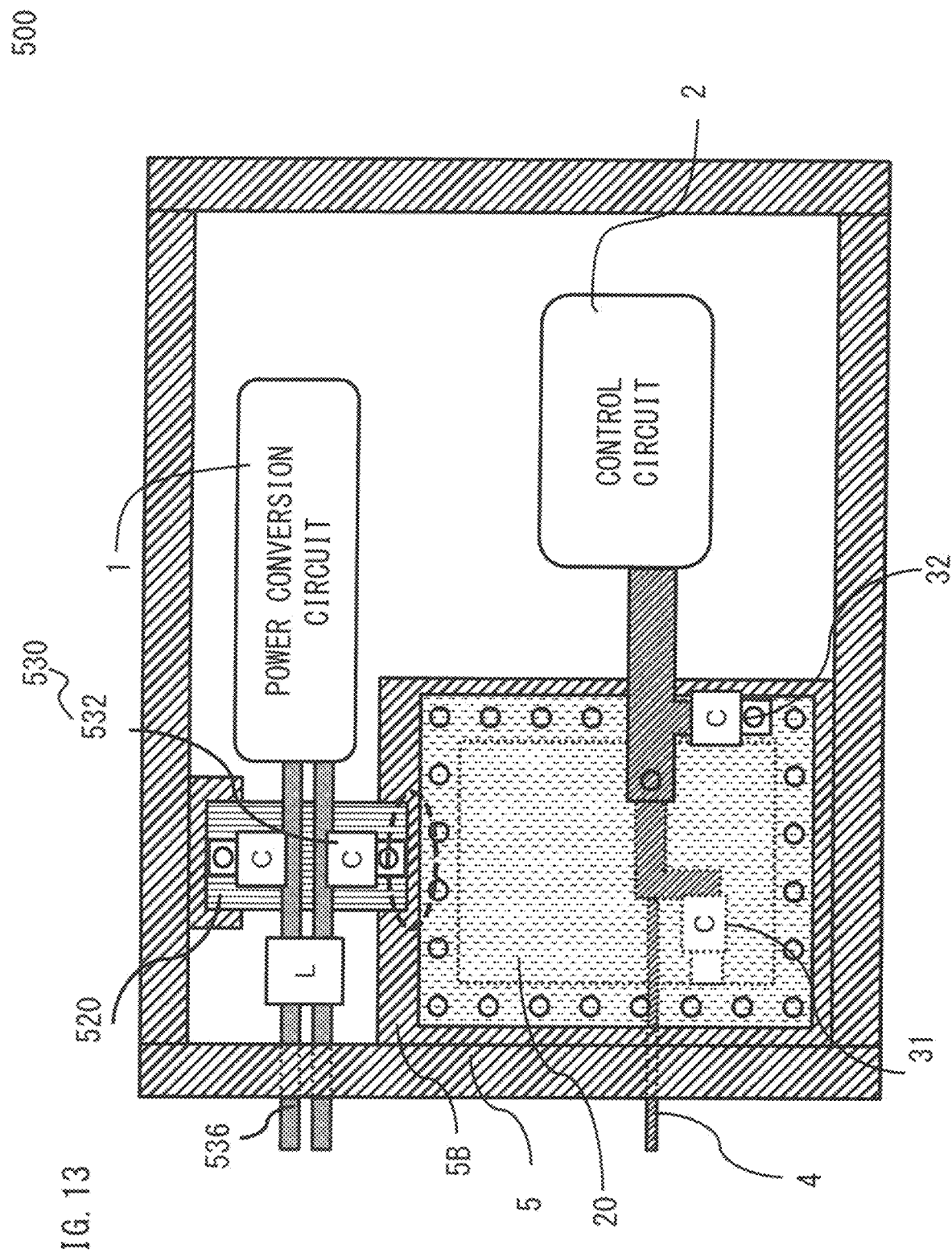
FIG. 13 is a top view showing a schematic configuration of a power conversion device according to Embodiment 5.

FIG. 13 is a top view showing a schematic configuration of a power conversion device 500 according to Embodiment 5.

The reference potential pattern of the present embodiment is formed so as to have a ground pattern 20 as a first reference potential pattern which is the same reference potential pattern as in Embodiment 1, and a ground pattern 520 as a second reference potential pattern which is formed independently of the ground pattern 20.

Similar to Embodiment 1, the ground pattern 20 is connected to the housing wall 5B, and the ground pattern 520 is also connected to the housing wall 5B. The housing wall 5B which functions as a slit is interposed between the connection point between the ground pattern 20 and the housing wall 5B and the connection point between the ground pattern 520 and the housing wall 5B as shown by a dotted circle in FIG. 13. As described above, the housing 5 is interposed between the ground pattern 20 and the ground pattern 520, and the ground pattern 20 and the ground pattern 520 are not directly connected.

Furthermore, in the present embodiment, in addition to the first filter circuit 30 which is the same as in Embodiment 1, a second filter circuit 530, for the power conversion circuit 1, which has a second capacitor 532 is provided at a position adjacent to the ground pattern 520. The second capacitor 532 of the second filter circuit 530 is connected at a first end thereof to a non-ground pattern 536 as a control conductive path for driving the power conversion circuit 1, and connected at a second end thereof to the ground pattern 520.

As described above, in the present embodiment, the second capacitor is formed so as to have a second capacitor 32, which is the same as in Embodiment 1, as a second A capacitor, and the second capacitor 532 as a second B capacitor.

A larger noise current flows through the second capacitor 532 of the second filter circuit 530, which is disposed near the power conversion circuit 1, than through the second capacitor 32. If this noise current flows through the ground pattern 20, noise may enter the shield region EA. Therefore, by interposing the housing wall 5B between the ground pattern 20 and the second ground pattern 520 to provide a slit as in the present embodiment, the noise current flowing through the second capacitor 532 of the second filter circuit 530 can be prevented from flowing through the ground pattern 20. Thus, noise can be prevented from entering the shield region 6A, so that an increase in noise can be prevented.

In the power conversion device of the present embodiment configured as described above,
the reference potential pattern is formed so as to have a first reference potential pattern and a second reference potential pattern which are formed independently of each other and connected to the housing,
the housing is formed so as to be interposed between a connection point between the first reference potential pattern and the housing and a connection point between the second reference potential pattern and the housing, and
the second capacitor has
a second A capacitor which is connected at a first end thereof to the control conductive path for driving the control circuit and connected at a second end thereof to the first reference potential pattern, and
a second B capacitor which is connected at a first end thereof to the control conductive path for driving the power conversion circuit and connected at a second end thereof to the second reference potential pattern.

By separately forming the second capacitor for the power conversion circuit and the ground pattern of the second capacitor for the control circuit as described above, it is possible to provide a power conversion device that prevents noise from entering the shield space and has high reliability.

Embodiment 6

Hereinafter, Embodiment 6 of the present disclosure will be described with reference to the drawing, focusing on differences from Embodiment 1 described above. The same portions as those in Embodiment 1 described above are denoted by the same reference characters, and the description thereof is omitted.

Figure 14:
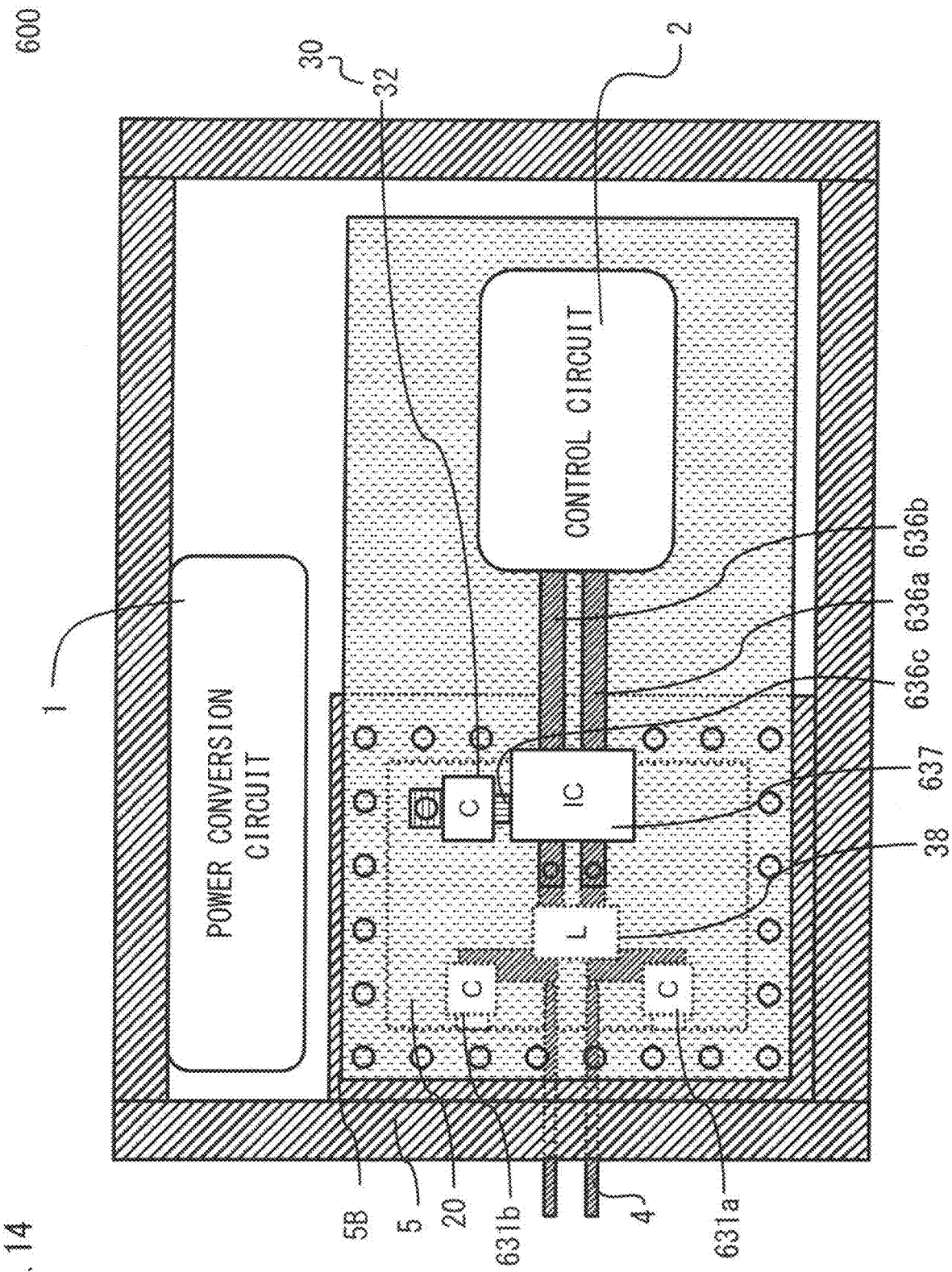
FIG. 14 is a top view showing a schematic configuration of a power conversion device according to Embodiment 6.

FIG. 14 is a top view showing a schematic configuration of a power conversion device 600 according to Embodiment 6.

In the power conversion device 600 according to Embodiment 6, the control conductive path for controlling the control circuit 2 includes a differential communication signal pattern 636a as a first conductive path for transmitting a positive first signal, and a differential communication signal pattern 636b as a second conductive path for transmitting a negative second signal which is paired with the first signal to constitute a differential signal. A differential communication IC 637 which relays the signals in the differential communication signal patterns 636a and 636b is provided on the second main surface 3B, and a third conductive path 636c which is a control conductive path for supplying power to the differential communication IC 637 is wired.

Since the differential communication signal includes the positive and negative signals as described above, two types, a first A capacitor 631a on the positive side and a first B capacitor 631b on the negative side, are provided as a first capacitor disposed inside the shield region 6A. The first A capacitor 631a is connected at a first end thereof to the differential communication signal pattern 636a and connected at a second end thereof to the ground pattern 20. In addition, the first B capacitor 631b is connected at a first end thereof to the differential communication signal pattern 636b and connected at a second end thereof to the ground pattern 20.

The second capacitor 32 which is provided outside the shield region 6A is connected at the first end thereof to the third conductive path 636c and connected at the second end thereof to the ground pattern 20. As described above, the first end of the second capacitor 32 is connected to the third conductive path 636c for supplying power to the differential communication IC 637, and the differential communication signal patterns 636a and 636b are not directly connected.

The inductor 38 is connected to the differential communication signal patterns 636a and 636b inside the shield region 6A between the differential communication IC 637 and the first A capacitors 631a and 631b.

The inductor 38 does not have to be provided, but by inserting the inductor 38 between the differential communication IC 637 and the first A capacitor 631a and 631b, the noise reduction effect can be enhanced.

The inductor 38 may be provided separately on each of the positive side and the negative side, or an inductor integrated on the positive side and the negative side, such as a common-mode inductor, may be provided.

Even if the second capacitor 32 is directly connected to the differential communication signal patterns 636a and 636b on the second main surface 3B side, a noise reduction effect is achieved, but if the capacities of the capacitors connected to the differential communication signal patterns 636a and 636b are excessively increased, a signal waveform may be degraded, causing a malfunction. By connecting the second capacitor 32 to the third conductive path 636c which is a power supply pattern for the differential communication IC 637 as in the present embodiment, the number of capacitors connected to the differential communication signal patterns 636a and 636b can be reduced without deteriorating the noise reduction effect, and degradation of the signal waveform can be prevented.

In the case where a second capacitor that is formed to have a smaller capacitance than the second capacitor 32 and has a capacitance that does net influence the signal waveform in the differential communication signal patterns 636a and 636b is provided, the second capacitor may be directly connected to the differential communication signal patterns 636a and 636b. In this case as well, degradation of the signal waveform can be prevented without deteriorating the noise reduction effect.

In the power conversion device of the present embodiment configured as described above, the control conductive path is formed so as to have a first conductive path for transmitting a first signal, a second conductive path for transmitting a second signal which is paired with the first signal to constitute a differential signal, and a third conductive path for supplying power to a differential communication circuit unit which relays the first signal and the second signal between the control circuit and the differential communication circuit unit, the first capacitor includes a first A capacitor which is connected at a first end thereof to the first conductive path and a first B capacitor which is connected at a first end thereof to the second conductive path, and the second capacitor is connected at the first end thereof to the third conductive path.

Accordingly, it is possible to provide a power conversion device that prevents deterioration of the signal waveform for controlling the control circuit, without deteriorating the noise reduction effect, and operates with high reliability.

Embodiment 7

Hereinafter, Embodiment 7 of the present disclosure will be described with reference to the drawing, focusing on differences from Embodiment 6 described above. The same portions as those in Embodiment 1 described above are denoted by the same reference characters, and the description thereof is omitted.

Figure 15:
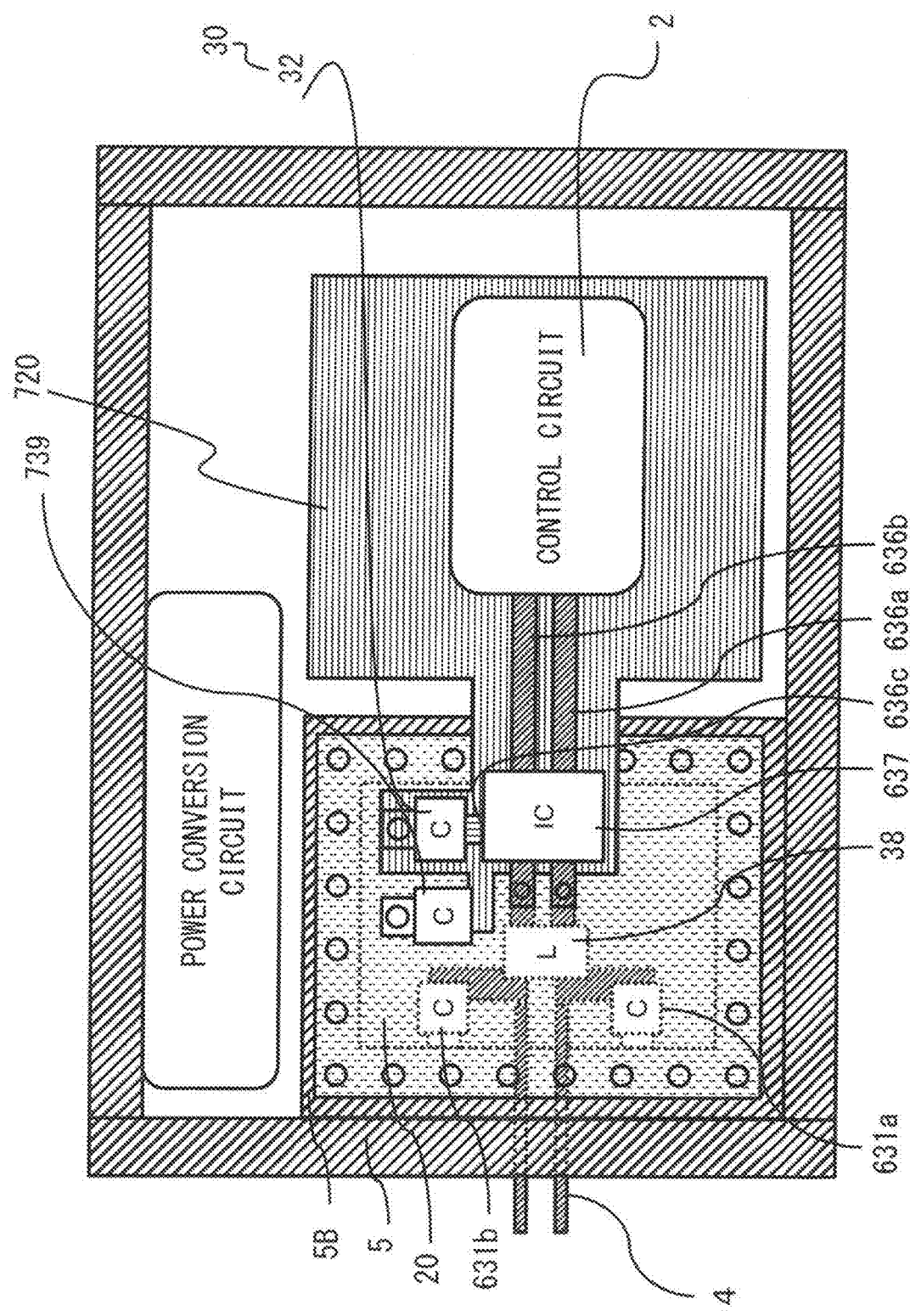
FIG. 15 is a top view showing a schematic configuration of a power conversion device according to Embodiment 7.

FIG. 15 is a top view showing a schematic configuration of a power conversion device 700 according to Embodiment 7.

The reference potential pattern of the present embodiment is formed so as to have a ground pattern 20 as a first reference potential pattern which is the same reference potential pattern as in Embodiment 1, and a ground pattern 720 as a third reference potential pattern which is formed independently of the ground pattern 20.

The ground pattern 720 is provided with a reference potential for a drive signal for driving the control circuit 2, and the potential of the ground pattern 720 is different from that of the ground pattern 20.

In the power conversion device 700 of the present embodiment, the second end of the second capacitor 32 is not connected to the ground pattern 20, but connected to the ground pattern 720.

Furthermore, in the present embodiment, in addition to the second capacitor 32, a stabilizing capacitor 739 for suppressing fluctuation of the potential of the ground pattern 720 is provided. The stabilizing capacitor 739 is connected at a first end thereof to the ground pattern 720 and connected at a second end thereof to the ground pattern 20.

The control circuit 2 operates on the basis of the potential of the reference potential pattern 720. Since the potential of the reference potential pattern 720 is different from that of the ground pattern 20, when noise propagates from the power conversion circuit 1 to the reference potential pattern 720, the reference potential fluctuates, causing the noise to be superimposed on the differential communication IC 637 and increasing the noise in the differential communication signal patterns 636a and 636b.

In the present embodiment, by providing the stabilizing capacitor 739 dedicated for the reference potential pattern 720, noise propagating to the reference potential pattern 720 can be bypassed to the housing 5, thereby preventing fluctuation of the reference potential pattern 720 and preventing an increase in the noise in the differential communication signal patterns 636a and 636b.

In the power conversion device of the present embodiment configured as described above, the reference potential pattern is formed so as to have a third reference potential pattern which is provided with a reference potential for a drive signal for driving the control circuit, and a first reference potential pattern which is formed independently of the third reference potential pattern, and the filter circuit includes a stabilizing capacitor which is connected at a first end thereof to the third reference potential pattern and connected at a second end thereof to the first reference potential pattern.

Accordingly, it is possible to provide a power conversion device that prevents fluctuation of the reference potential pattern to reduce noise in the control conductive path for controlling the control circuit and operates with high reliability.

Moreover, in the power conversion device of the present embodiment configured as described above, the reference potential pattern is formed so as to have a third reference potential pattern which is provided with a reference potential for a drive signal for driving the control circuit, and a first reference potential pattern which is formed independently of the third reference potential pattern, and the second capacitor is connected at the first end thereof to the third conductive path and connected at the second end thereof to the third reference potential pattern.

Accordingly, it is possible to provide a power conversion device that prevents degradation of the signal waveform for controlling the control circuit, without deteriorating the noise reduction effect, and operates with high reliability.

Similar to Embodiment 6 described above, a second capacitor that is formed to have a smaller capacitance than the second capacitor 32 and has a capacitance that does not influence the signal waveform in the differential communication signal patterns 636a and 636b may be provided and directly connected to the differential communication signal patterns 636a and 636b. In this case as well, degradation of the signal waveform can be prevented without deteriorating the noise reduction effect.

Embodiment 8

Hereinafter, Embodiment 8 of the present disclosure will be described with reference to the drawing, focusing on differences from Embodiment 7 described above. The same portions as those in Embodiment 7 described above are denoted by the same reference characters, and the description thereof is omitted.

Figure 16:
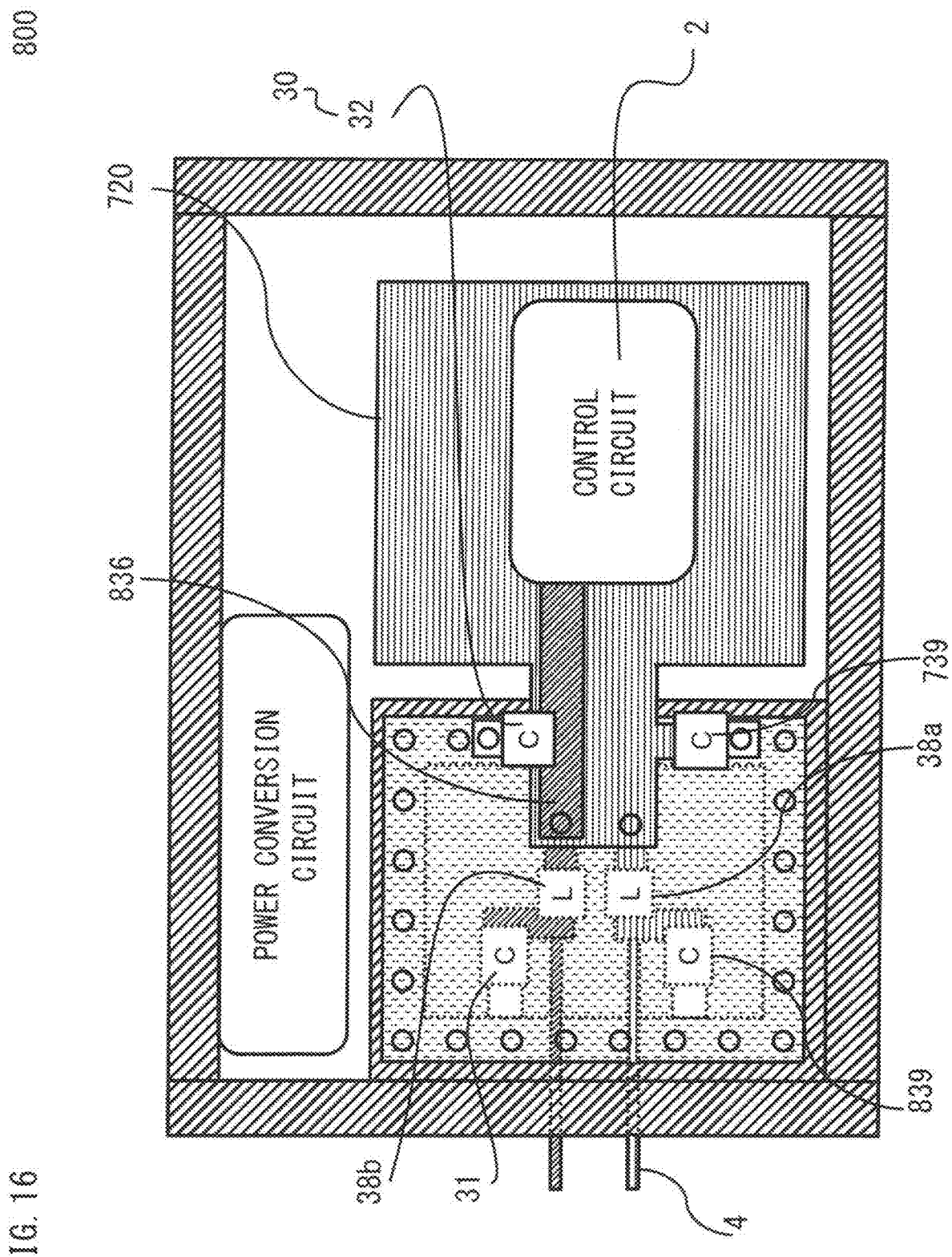
FIG. 16 is a top view showing a schematic configuration of a power conversion device according to Embodiment 8.

FIG. 16 is a top view showing a schematic configuration of a power conversion device 800 according to Embodiment 8.

In the present embodiment, similar to Embodiment 7, the ground pattern 720 is formed independently of the ground pattern 20. In addition, in the present embodiment, a power supply pattern 836 for supplying power to the control circuit 2 is provided as a control conductive path for controlling the control circuit 2.

The first capacitor 31 which is provided on the first main surface 3A side of the printed board 3 is connected at the first end thereof to the power supply pattern 836 as a control conductive path, and connected at the second end thereof to the ground pattern 20 as a reference potential pattern.

Moreover, the second capacitor 32 which is provided on the second main surface 3B side of the printed board 3 is connected at the first end thereof to the power supply pattern 836 as a control conductive path, and connected at the second end thereof to the ground pattern 20 as a reference potential pattern.

Similar to Embodiment 7, the stabilizing capacitor 739 for suppressing fluctuation of the potential of the ground pattern 720 is connected at the first end thereof to the ground pattern 720, and connected at the second end thereof to the ground pattern 20.

Moreover, in the present embodiment, a stabilizing capacitor 839 for suppressing fluctuation of the potential of the ground pattern 720 is provided on the first main surface 3A in the shield region 3A of the printed board 3. The stabilizing capacitor 839 is connected at a first end thereof to the around pattern 720 and connected at a second end thereof to the ground pattern 20.

Inductors 38*a* and 38*b* do not have to be provided, but by inserting the inductors 38*a* and 38*b* between the first capacitor 31 and the second capacitor 32 and between the stabilizing capacitor 839 and the stabilizing capacitor 739, respectively, the noise reduction effect can be enhanced. Two inductors may be integrated by making the inductors 38*a* and 38*b* into a common-mode inductor.

The control circuit 2 operates on the basis of the potential of the reference potential pattern 720. Since the potential of the reference potential pattern 720 is different from that of the ground pattern 20, when noise propagates from the power conversion circuit 1 to the reference potential pattern 720, noise propagating to the device outside via the external connection wire 4 is increased. In the present embodiment, by not only providing the capacitors for the power supply pattern 836 but also providing the stabilizing capacitors 739 and 839 for the reference potential pattern 720, noise propagating to the reference potential pattern 720 is bypassed to the housing 5. Accordingly, noise in a power supply line can be reduced, and in addition, noise in the reference potential pattern 720 can be reduced, so that noise propagating to the device outside can be reduced.

In the power conversion device of the present embodiment configured as described above,
the reference potential pattern is formed so as to have a third reference potential pattern which is provided with a reference potential for a drive signal for driving the control circuit, and a first reference potential pattern which is formed independently of the third reference potential pattern, and
the second capacitor is connected at the first end thereof to a power supply line as the control conductive path for supplying power to the control circuit, and connected at the second end thereof to the first reference potential pattern.

Accordingly, noise in the power supply line can be reduced, and noise propagating to the device outside can be reduced.

Embodiment 9

Hereinafter, Embodiment 9 of the present disclosure will be described with reference to the drawing, focusing on differences from Embodiment 8 described above. The same portions as those in Embodiment 8 described above are denoted by the same reference characters, and the description thereof is omitted.

Figure 17:
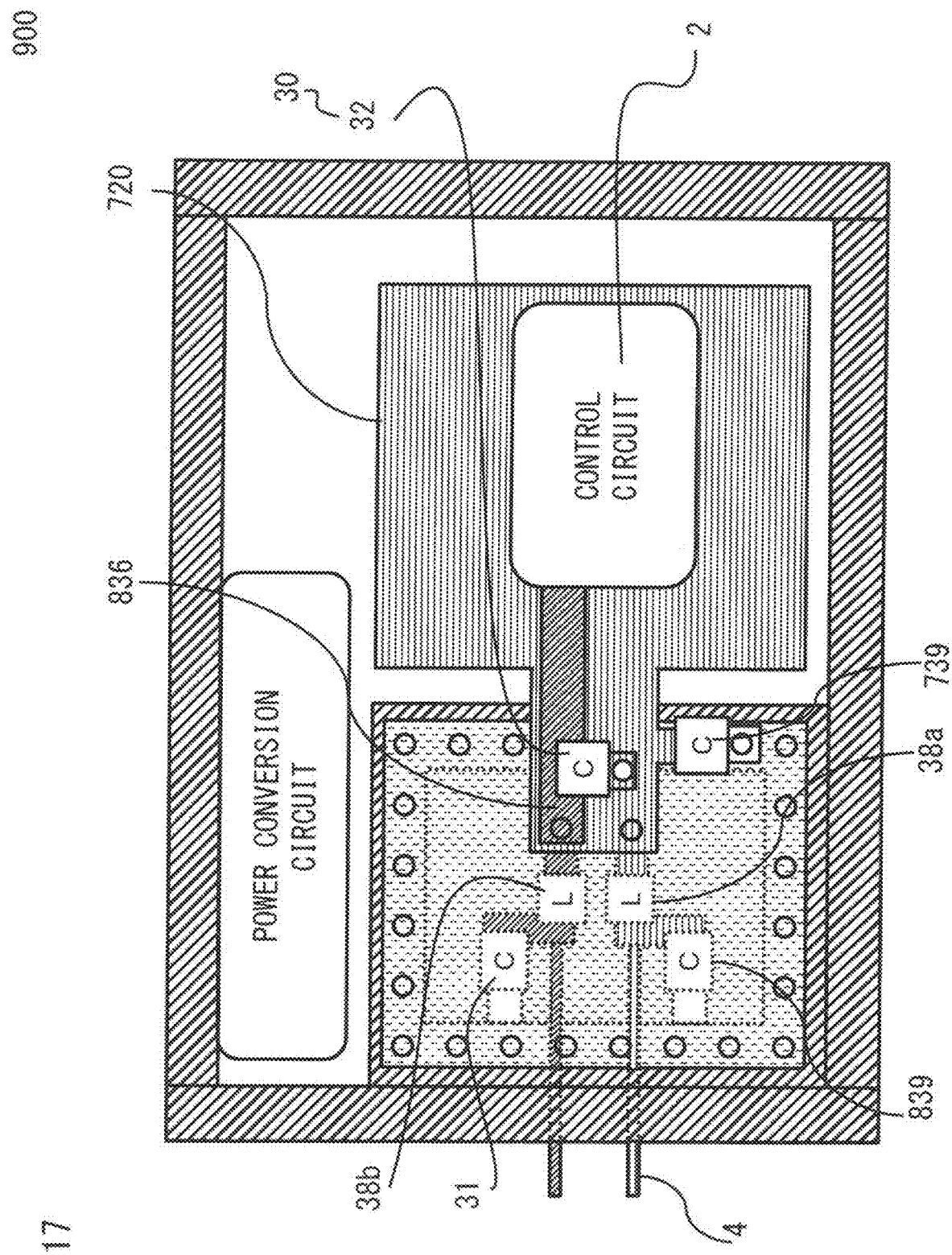
FIG. 17 is a top view showing a schematic configuration of a power conversion device according to Embodiment 9.

FIG. 17 is a top view showing a schematic configuration of a power conversion device 900 according to Embodiment 9.

The power conversion device according to Embodiment 9 basically has the same configuration as the power conversion device according to Embodiment 8, but is different therefrom in that the second capacitor 32 connected at the first end thereof to the power supply pattern 836 as a control conductive path is not connected at the second end thereof to the ground pattern 20 but connected at the second end thereof to the reference potential pattern 720.

In the power conversion device of the present embodiment configured as described above,
the reference potential pattern is formed so as to have a third reference potential pattern which is provided with a reference potential for a drive signal for driving the control circuit, and a first reference potential pattern which is formed independently of the third reference potential pattern, and
the second capacitor is connected at the first end thereof to a power supply line as the control conductive path for supplying power to the control circuit, and connected at the second end thereof to the third reference potential pattern.

Accordingly, while the effect achieved in Embodiment 8 is maintained, noise generated when a magnetic flux generated by the power conversion circuit 1 interlinks between the power supply pattern 836 and the reference 10 potential pattern 720 can be reduced.

Embodiment 10

Hereinafter, Embodiment 10 of the present disclosure will be described with reference to the drawing, focusing on differences from Embodiment 1 described above. The same portions as those in Embodiment 1 described above are denoted by the same reference characters, and the description thereof is omitted.

Figure 18:
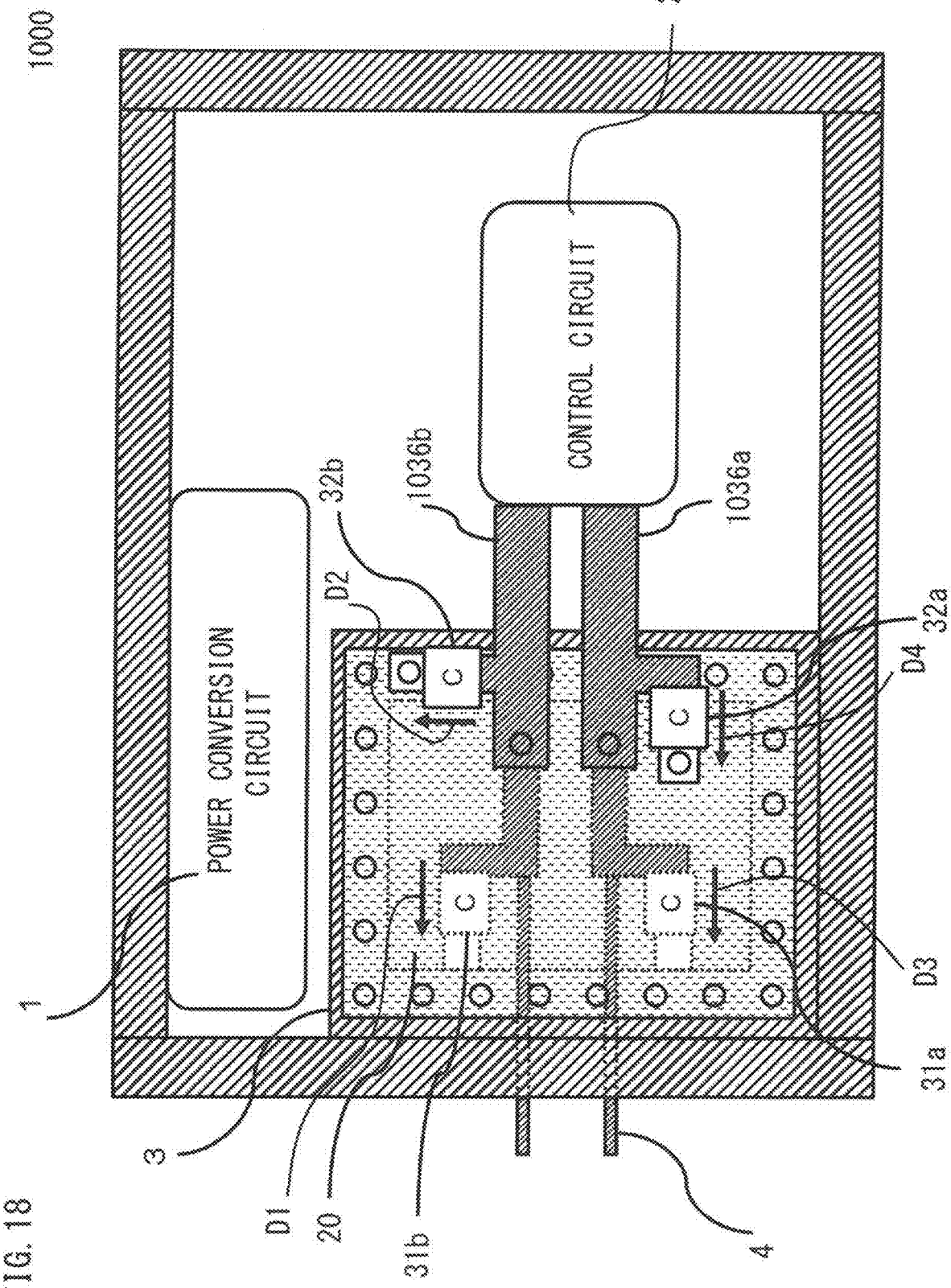
FIG. 18 is a cross-sectional view showing a schematic configuration of a power conversion device according to Embodiment 10.

FIG. 18 is a top view showing a schematic configuration of a power conversion device 1000 according to Embodiment 10.

The power conversion device according to Embodiment 10 basically has the same configuration as the power conversion device according to Embodiment 1, but includes a plurality of non-ground patterns as a control conductive path for controlling the control circuit 2. In the present embodiment, two non-ground patterns 1036*a* and 1036*b* are shown. The present embodiment is different from Embodiment in that a pair of a first capacitor 31*a* and a second capacitor 32*a* and a pair of a first capacitor 31*b* and a second capacitor 32*b* are provided for the plurality of non-ground patterns 1036*a* and 1036*b*, respectively.

In the present embodiment, the case of two types of the non-ground patterns 1036*a* and 1036*b* is shown, but three or more types may be provided. The non-ground patterns 1036*a* and 1036*b* may each be a power supply pattern for supplying power to the control circuit, a signal pattern for transmitting a signal to the control circuit, or a reference potential pattern serving as a reference potential for the control circuit.

Here, the first capacitor 31*b* for the non-ground pattern 1036*b* and the second capacitor 32*b* for the non-ground pattern 1036*b* are mounted such that directions D1 and D2 from the first ends toward the second ends thereof are orthogonal to each other. However, the first capacitor 31*a* for the non-ground pattern 1036*a* and the second capacitor 32*a* for the non-ground pattern 1036*a* are not mounted such that directions D3 and D4 from the first ends toward the second ends thereof are orthogonal to each other.

If noise superimposed on the non-ground pattern 1036*a* is smaller than that on the non-ground pattern 1036*b*, a magnetic flux that enters the shield region 6A is mainly generated in the second capacitor 32*b* for the non-ground pattern 1036*b*. Therefore, even when the second capacitor 32*a* for the non-ground pattern 1036*a* and the first capacitor 31*a* for the non-ground pattern 1036*a* are not orthogonally disposed relative to each other, the effect of reducing noise is achieved by orthogonally disposing the second capacitor 32*b* for the non-ground pattern 1036*b* and the first capacitor 31*b* for the non-ground pattern 1036*b* relative to each other.

In the case where there are a plurality of non-ground patterns and a pair of a first capacitor and a second capacitor are provided for each non-ground pattern as described above, not all the pairs of the first capacitor and the second capacitor 32 necessarily have to be orthogonal to each other. When the directions of the first capacitor and the second capacitor are changed, the angle therebetween does not necessarily need to be 90 degrees, and a noise reduction effect can be achieved when the directions are different from each other by 45 degrees to 135 degrees.

In the power conversion device of the present embodiment configured as described above,
a plurality of the control conductive paths are provided, and a pair of the first capacitor and the second capacitor are provided for each of the control conductive paths, and
at least one pair of the first capacitor and the second capacitor, among a plurality of the pairs of the first capacitor and the second capacitor, are disposed such that a direction from the first end toward the second end of the first capacitor forms an angle not less than 45 degrees and not greater than 135 degrees, with respect to a direction from the first end toward the second end of the second capacitor, as seen in a direction orthogonal to the first main surface.

Accordingly, the first capacitor and the second capacitor that form an angle not less than 45 degrees and not greater than 135 degrees can be determined according to noise propagated to the non-ground pattern. Thus, since not all the pairs of the first capacitor and the second capacitor 32 have to be configured to form the above set angle, it is possible to reduce a wiring region in the printed board to downsize the power conversion device.

Embodiment 11

Hereinafter, Embodiment 11 of the present disclosure will be described with reference to the drawing, focusing on differences from Embodiment 1 described above. The same portions as those in Embodiment 1 described above are denoted by the same reference characters, and the description thereof is omitted.

Figure 19:
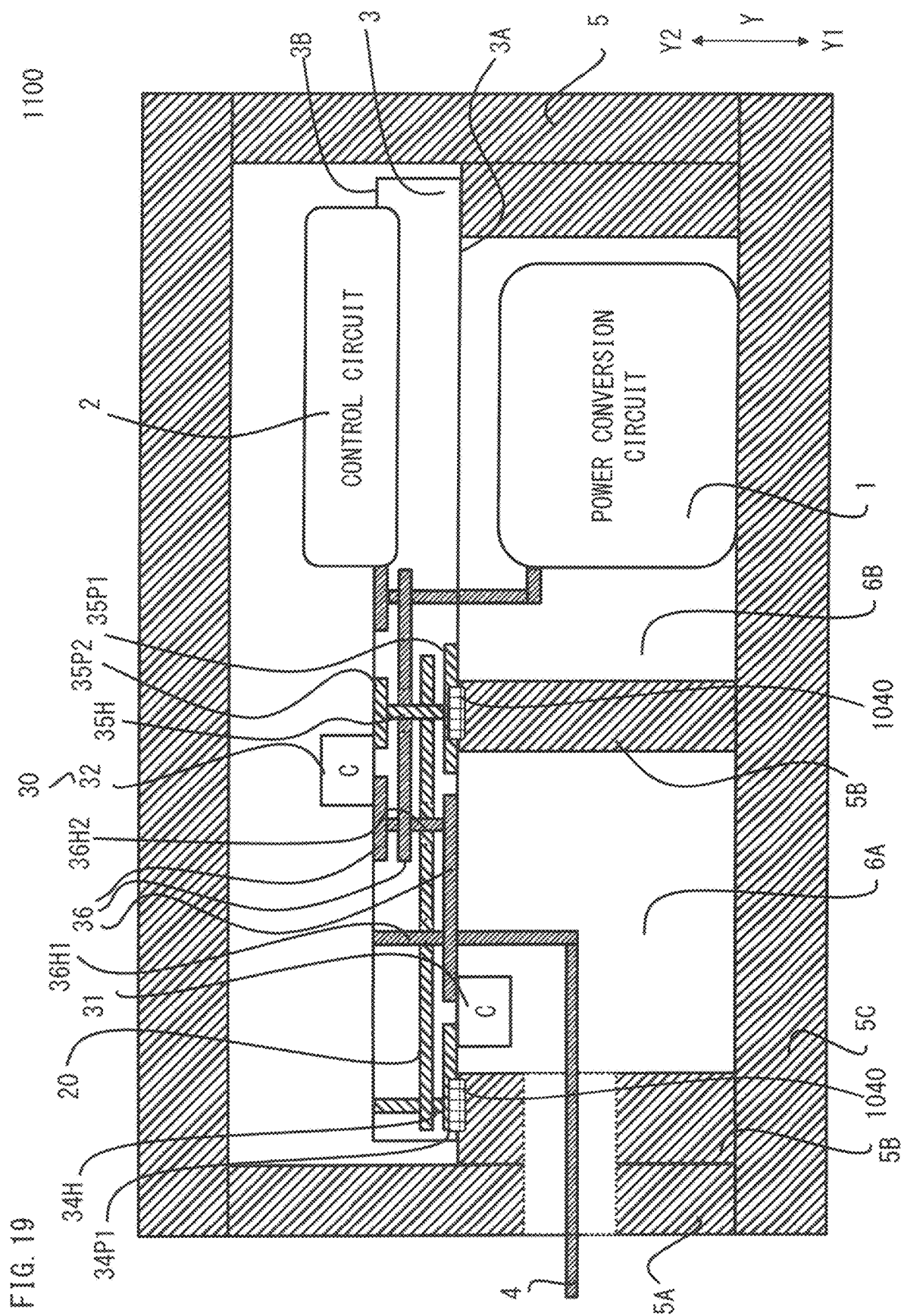
FIG. 19 is a top view showing a schematic configuration of a power conversion device according to Embodiment 11.

FIG. 19 is a cross-sectional view showing a schematic configuration of a power conversion device 1100 according to Embodiment 11.

The power conversion device 100 according to Embodiment 11 basically has the same configuration as the power conversion device 1000 according to Embodiment 1, but is different therefrom in that a conductive gasket 1040 is provided at contact surfaces between the first ground pads 34P1 and 35P1 and the housing wall 5B.

Accordingly, the first ground pads 34P1 and 31B and the housing wall 5B are connected without gaps, so that the shielding effect is improved and the noise reduction effect is improved. Examples of the gasket include metal meshes, metal shield fingers, rubbers and sponges containing carbon fibers, conductive rubbers and sponges containing metal particles, and sponges wrapped with conductive fabrics.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 power conversion circuit
2 control circuit
3 printed board (circuit wiring board)
5 housing
30, 530 first filter circuit
38 inductor
5B housing wall (shield wall)
5C bottom surface (shield wall)
36H1, 36H2 through hole (first connection hole)
31, 631*a*, 631*b* first capacitor
32, 33 second capacitor
739, 839 stabilizing capacitor
100, 100*a*, 100*b*, 100*c*, 100*d*, 100*f*, 200, 300, 400, 500, 600, 700, 800, 900, 1000, 1100 power conversion device

The invention claimed is:
1. A power conversion device comprising:
a power conversion circuit which converts power;
a control circuit which controls the power conversion circuit;
a filter circuit which is connected to a conductive path for driving at least either the control circuit or the power conversion circuit and suppresses electromagnetic noise in the conductive path;
a circuit wiring board which is a printed board on which the filter circuit is provided and in which a reference potential pattern is formed on an inner layer; and
a housing which holds the circuit wiring board, wherein
the reference potential pattern is connected to the housing,
the housing has a shield wall which is provided at a side of a first main surface which is a surface layer on one side in a thickness direction of the circuit wiring board, an electromagnetic shield region which is surrounded by the shield wall and the reference potential pattern is formed in the housing, and the power conversion circuit is provided outside the electromagnetic shield region,
the conductive path is wired into the electromagnetic shield region so as to be led from the outside of the electromagnetic shield region into the electromagnetic shield region via a first connection hole which connects wiring conductors on at least two layers of the circuit wiring board, wherein the first connection hole is a through hole which connects the wiring conductor on the first main surface and a wiring conductor on a second main surface which is a surface layer on a side opposite to the first main surface, or a via hole which connects wiring conductors on at least two layers of the circuit wiring board.

2. The power conversion device according to claim 1, wherein the filter circuit has a first capacitor which is provided inside the electromagnetic shield region of the circuit wiring board, connected at a first end thereof to the control conductive path inside the electromagnetic shield region, and connected at a second end thereof to the reference potential pattern.

3. The power conversion device according to claim 2 wherein the filter circuit has a second capacitor which is provided outside the electromagnetic shield region of the circuit wiring board, connected at a first end thereof to the control conductive path, and connected at a second end thereof to the reference potential pattern.

4. The power conversion device according to claim 3, wherein the reference potential pattern is connected to the housing via a second connection hole which connects the reference potential pattern and a wiring conductor on the first main surface of the circuit wiring board, and the electromagnetic shield region is further surrounded by the second connection hole in addition to the shield wall and the reference potential pattern.

5. The power conversion device according to claim 4, wherein the reference potential pattern is connected to the housing via the second connection hole and a connection pad which is formed on a contact portion, in the first main surface, between the second connection hole and the shield wall of the housing.

6. The power conversion device according to claim 5, wherein the shield wall of the housing is formed so as to have a housing bottom portion which is formed so as to be parallel to the first main surface of the circuit wiring board, and a housing wall portion which extends from the housing bottom portion toward the first main surface side of the circuit wiring board and comes into contact with the first main surface, and the connection pad is formed on a contact portion, in the first main surface, between the housing wall portion and the first main surface.

7. The power conversion device according to claim 6, further comprising a conductive gasket at a contact surface between the connection pad and the housing wall portion.

8. The power conversion device according to claim 5, further comprising an inductance which is connected in series with the conductive path between the second end of the first capacitor and the second end of the second capacitor.

9. The power conversion device according to claim 4, further comprising an inductance which is connected in series with the conductive path between the second end of the first capacitor and the second end of the second capacitor.

10. The power conversion device according to claim 4, wherein the reference potential pattern is formed so as to have a first reference potential pattern and a second reference potential pattern which are formed independently of each other and connected to the housing, the housing is formed so as to be interposed between a connection point between the first reference potential pattern and the housing and a connection point between the second reference potential pattern and the housing, and the second capacitor has a second A capacitor which is connected at a first end thereof to the conductive path for driving the control circuit and connected at a second end thereof to the first reference potential pattern, and a second B capacitor which is connected at a first end thereof to the conductive path for driving the power conversion circuit and connected at a second end thereof to the second reference potential pattern.

11. The power conversion device according to claim 3, further comprising an inductance which is connected in series with the conductive path between the second end of the first capacitor and the second end of the second capacitor.

12. The power conversion device according to claim 3, wherein the reference potential pattern is formed so as to have a first reference potential pattern and a second reference potential pattern which are formed independently of each other and connected to the housing, the housing is formed so as to be interposed between a connection point between the first reference potential pattern and the housing and a connection point between the second reference potential pattern and the housing, and the second capacitor has a second A capacitor which is connected at a first end thereof to the conductive path for driving the control circuit and connected at a second end thereof to the first reference potential pattern, and a second B capacitor which is connected at a first end thereof to the conductive path for driving the power conversion circuit and connected at a second end thereof to the second reference potential pattern.

13. The power conversion device according to claim 3, wherein the reference potential pattern is formed so as to have a third reference potential pattern which is provided with a reference potential for a drive signal for driving the control circuit, and a first reference potential pattern which is formed independently of the third reference potential pattern, and the filter circuit includes a stabilizing capacitor which is connected at a first end thereof to the third reference potential pattern and connected at a second end thereof to the first reference potential pattern.

14. The power conversion device according to claim 3, wherein the reference potential pattern is formed so as to have a third reference potential pattern which is provided with a reference potential for a drive signal for driving the control circuit, and a first reference potential pattern which is formed independently of the third reference potential pattern, and the second capacitor is connected at the first end thereof to a power supply line as the conductive path for supplying power to the control circuit, and connected at the second end thereof to the first reference potential pattern or the third reference potential pattern.

15. The power conversion device according to claim 1, wherein the reference potential pattern is connected to the housing via the second connection hole and a connection pad which is formed on a contact portion, in the first main surface, between the second connection hole and the shield wall of the housing.

16. The power conversion device according to claim 15, further comprising an inductance which is connected in series with the conductive path between the second end of the first capacitor and the second end of the second capacitor.

17. The power conversion device according to claim 1, further comprising an inductance which is connected in series with the conductive path between the second end of the first capacitor and the second end of the second capacitor.

18. The power conversion device according to claim 1, wherein the reference potential pattern is formed so as to have a first reference potential pattern and a second reference potential pattern which are formed independently of each other and connected to the housing, the housing is formed so as to be interposed between a connection point between the first reference potential pattern and the housing and a connection point between the second reference potential pattern and the housing, and the second capacitor has a second A capacitor which is connected at a first end thereof to the conductive path for driving the control circuit and connected at a second end thereof to the first reference potential pattern, and a second B capacitor which is connected at a first end thereof to the conductive path for driving the power conversion circuit and connected at a second end thereof to the second reference potential pattern.

19. A power conversion device comprising:

a power conversion circuit which converts power;

a control circuit which controls the power conversion circuit; a filter circuit which is connected to a conductive path for driving at least either the control circuit or the power conversion circuit and suppresses electromagnetic noise in the conductive path;

a circuit wiring board which is a printed board on which the filter circuit is provided and in which a reference potential pattern is formed on an inner layer; and a housing which holds the circuit wiring board, wherein the reference potential pattern is connected to the housing, the housing has a shield wall which is provided at a side of a first main surface which is a surface layer on one side in a thickness direction of the circuit wiring board, an electromagnetic shield region which is surrounded by the shield wall and the reference potential pattern is formed in the housing, and the power conversion circuit is provided outside the electromagnetic shield region, the conductive path is wired into the electromagnetic shield region so as to be led from the outside of the electromagnetic shield region into the electromagnetic shield region via a first connection hole which connects wiring conductors on at least two layers of the circuit wiring board, the reference potential pattern is formed so as to have a first reference potential pattern and a second reference potential pattern which are formed independently of each other and connected to the housing, and the housing is formed so as to be interposed between the first reference potential pattern and the second reference potential pattern.

\* \* \* \* \*